(12) United States Patent
Rossi

(10) Patent No.: US 7,623,171 B2
(45) Date of Patent: Nov. 24, 2009

(54) MULTIPLE CRAWBAR SWITCHING IN CHARGE DOMAIN LINEAR OPERATIONS

(75) Inventor: Giuseppe Rossi, Pasadena, CA (US)

(73) Assignee: Aptina Imaging Corporation, Grand Cayman (KY)

( * ) Notice: Subject to any disclaimer, the term of this patent is extended or adjusted under 35 U.S.C. 154(b) by 1372 days.

(21) Appl. No.: 10/430,348

(22) Filed: May 7, 2003

(65) Prior Publication Data

US 2004/0222351 A1 Nov. 11, 2004

(51) Int. Cl.
*H04N 5/335* (2006.01)
(52) U.S. Cl. .................. 348/302; 348/294; 348/308; 250/208.1
(58) Field of Classification Search .................. 348/300
See application file for complete search history.

(56) References Cited

U.S. PATENT DOCUMENTS 6,166,367 A * 12/2000 Cho ................... 250/208.1
6,512,546 B1 * 1/2003 Decker et al. ............... 348/308
6,529,237 B1 * 3/2003 Tsay et al. .................. 348/241

OTHER PUBLICATIONS

Fraenkel, Miriam; CMOS Imager for Cellular Applications and Methods of Using Such; Dec. 5, 2002; WIPO, WO 02/098112 A2; p. 19 and Figure 4.*

* cited by examiner

*Primary Examiner*—Sinh Tran
*Assistant Examiner*—Paul Berardesca
(74) *Attorney, Agent, or Firm*—Dickstein Shapiro LLP

(57) ABSTRACT

An analog differential voltage circuit is disclosed that enables the combination of a plurality of voltage signals in the analog domain of a CMOS processing system prior to being received by a differential amplifier and prior to being digitized. By programming the column decoder to read out a plurality of column buffer circuits, a plurality of linear operations (e.g., addition, substation, averaging, weighted, sum) may be performed on the plurality of analog voltage levels prior to their being digitized.

72 Claims, 16 Drawing Sheets

US 7,623,171 B2

MULTIPLE CRAWBAR SWITCHING IN CHARGE DOMAIN LINEAR OPERATIONS

FIELD OF THE INVENTION

The present invention relates generally to signal processing, and more specifically, to circuits and methods for processing analog signals such as active pixel sensor array output signals.

BACKGROUND OF THE INVENTION

In recently developed complementary metal oxide semiconductor (CMOS) active pixel sensor (APS) devices, the values produced at the outputs of individual pixels within a CMOS APS sensor array have been subjected to various image processing techniques. One of these techniques, for example, is to digitize a stream of output values produced by an APS sensor array and then to direct the stream of output values into a digital memory device for storage. The stored values may then be accessed by a separate digital signal processor (DSP) and subjected to various known data transformations in order to improve image quality, or apply various special effects. More recently, efforts have been made to integrate digital signal processing circuits directly onto a common substrate along with a CMOS APS sensor array. According to one device architecture, analog data values produced by the APS sensor array are converted to digital values by analog-to-digital conversion circuits and provided directly to an on-chip DSP for immediate signal processing.

Such digital signal processing includes linear operations such as addition, subtraction, averaging, among other functions, as well as other linear combinations of arbitrary coefficient values. For example, in a CMOS camera light intensity signal values from the camera's pixel array are averaged to determine an average light intensity value. The array light intensity value then can be used to establish the exposure setting for the CMOS camera. Currently, the light intensity volume is determined in the DSP region.

FIG. 1 shows a conventional CMOS APS array and processing circuitry 100 including an image acquisition device 102 coupled to a digital signal processor system 103. The image acquisition device 102 includes a plurality of pixel cells 104, a plurality of row lines 106 and a plurality of column lines 108. Each pixel cell 104 includes a respective photosensitive device 112 such as a photodiode or phototransistor and a respective switching device 124 such as a field effect transistor. Each respective transistor 124 includes a gate coupled to a respective one of the plurality of row lines 106 and a drain coupled to a respective one on the plurality of column lines 108. The plurality of row lines 106 are coupled to, and under the control of, a row decoder circuit 114. Each column line 108 is coupled to an input 126, 128, 130 of a respective column buffer circuit 132, 134, 136.

In operation, during an integration period for generating an image signal voltage (Vsig) for a given pixel, an image is projected on the array of pixel cells 104 of the image acquisition device 102. Each pixel cell 104 generates an electrical charge proportional to incident light intensity at its respective location. The row decoder 114 then selects one row (e.g., row 120) of pixel cells 104 by placing a selection signal on the selected row line 106. Then column lines 108, controlled by column decoder 150, are activated one by one to read out the voltage generated by the pixel cell 104 so they can be stored in a sample and hold circuit (not shown) of a respective column buffer circuit 132, 134, 136.

FIG. 2 shows a portion of the FIG. 1 circuit in additional detail. In FIG. 2, a sample and hold circuit 206 is shown within column buffer 136; sample and hold circuit 206 is representative of other sample and hold circuits within other column buffer circuits, e.g., within column buffer 132, 134. The sample and hold circuit 206 includes crawbar switch 218 and capacitors 222, 226. FIG. 2 also shows gain stage circuit 155 which includes gain stage amplifier 164 and feedback capacitors 278.

Turning back to FIG. 1, each column buffer circuit 132, 134, 136 has a respective control input 140, 142, 144. The respective control inputs 140, 142, 144 are coupled to, and operate under the control of, a column decoder circuit 150. Column decoder 150 activates a respective column buffer 132, 134, 136, by simultaneously activating the crawbar switch 218 and selection switches 232, 240 within the column buffer circuit, in order to steer the signals stored in the selected column buffer to the gain stage 155, and thereafter into the analog-to-digital converter 162. Column decoder 150 is programmed such that only one of column buffer circuits 132, 134, 136 is activated for readout, (i.e., the activation of the respective crawbar switch 218 and selection switches 232, 240 within the column buffer circuit 132, 134, 136) at a time. This restriction on the column decoder 150 is also referred to as being "interlocked."

As seen in FIG. 1, each column buffer circuit 132, 134, 136 also has a respective analog output 152, 154, 156. The analog outputs 152, 154, 156 are mutually coupled through an analog gain stage 155, which includes differential amplifier 164, to an analog input 160 of an analog-to-digital converter (ADC) 162. Analog outputs 152, 154, 156 each represent a pair of outputs from a respective column buffer 132, 134, 136. Each respective pair of outputs is then differentiated by differential amplifier 164. The output of differential amplifier 164 (Vdiff) is referred to as:

$$V\text{diff} = V\text{in\_}p - V\text{in\_}n \quad (1)$$

In Eq. (1), Vin_p refers to a first signal voltage from a pixel and Vin_n refers to a second signal voltage from the same pixel. Typically, in a three transistor APS pixel, Vin_p corresponds to a reset signal voltage (e.g., Vrst) and Vin_n corresponds to an image signal voltage (e.g., Vsig).

Once Vdiff has been digitized by ADC 162, it is often desirable, and occasionally required, that a plurality of readings of Vdiff (e.g., received from a corresponding plurality of column buffer circuits) be combined with each other. For example, combining the Vdiff from a first and second pixel.

It is known to combine signals from different column buffer circuits in the digital domain of an imager by combining the (post ADC amplifier) Vdiff signals from the column buffer circuits. However, combining the signals from the column buffer circuits in the analog region of the imager could reduce the amount of noise introduced into the combined signal. Therefore, it is desirable to combine signals from different volume buffer circuits in the analog region of the imager to reduce the introduction of spurious noise into the outputted signal.

BRIEF SUMMARY OF THE INVENTION

The present invention addresses the problem described above in the prior art and provides circuits and methods for combining signals received from multiple column buffer circuits of an APS array in the analog domain of the array. A multiple crawbar switching method is disclosed for programming the access circuitry to concurrently read out a set of signals from a plurality of column buffer circuits. Further, a circuit is disclosed to concurrently read out a set of signals from two or more column buffer circuits so that the output signal of the gain stage circuit represents a linear combination of the respective input signals.

BRIEF DESCRIPTION OF THE DRAWINGS

These and other advantages and features of the invention will be more clearly understood from the following detailed description of the invention which is provided in connection with the accompanying drawings, in which.

DETAILED DESCRIPTION OF THE INVENTION

In the following detailed description, reference is made to the accompanying drawings, which form a part hereof, and in which is shown by way of illustration specific embodiments in which the invention may be practiced. These embodiments are described in sufficient detail to enable those of ordinary skill in the art to make and use the invention, and it is to be understood that structural, logical or other changes may be made to the specific embodiments disclosed without departing from the spirit and scope of the present invention.

As mentioned above, in many instances it is desirable to perform a linear operation (e.g., addition, subtraction, averaging, weighted averaging) on sampled signals in the analog, or charge domain, of a CMOS sensor. In accordance with the present invention, the operation of the column decoder (e.g., 450 of FIG. 3) is programmable such that column decoder 450 may select a plurality of column buffer circuits (e.g,. 432, 434, 436, FIG. 3) at substantially the same time for read out. These multiple values that are read out are then forwarded to the gain stage circuit 455 (of FIG. 3) to be combined during a linear operation in the analog domain.

Figure 3:
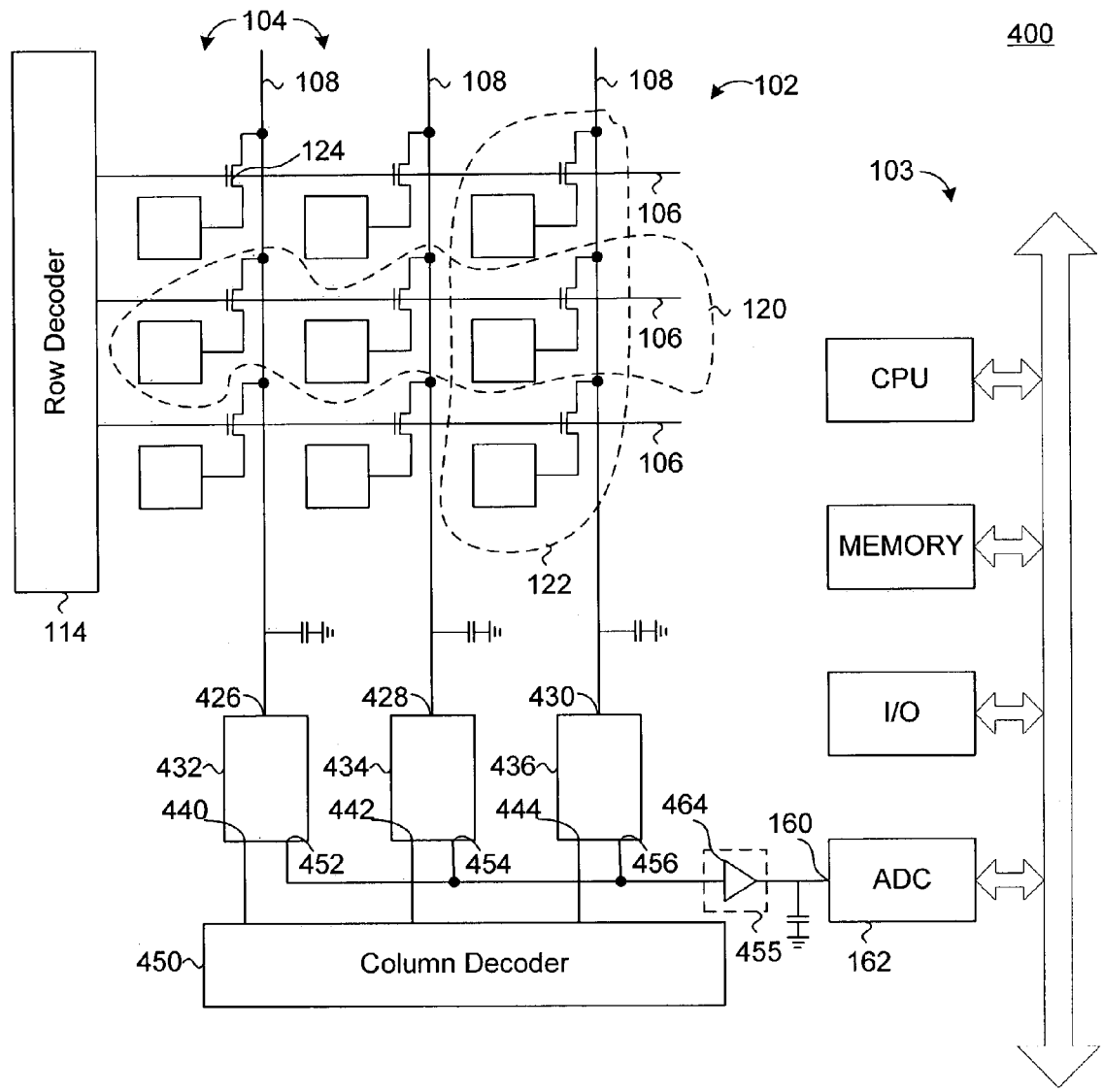
FIG. 3 shows a block diagram of an APS array and signal processing circuitry in accordance with an exemplary embodiment of the invention.

FIG. 3 shows a block diagram of an APS array and signal processing system in accordance with an exemplary embodiment of the invention. The FIG. 3 APS array and signal processing system 400 differs from the system 100 in several significant ways and which are described in greater detail below.

The column decoder 450 of the APS system 400 differs from the column decoder 150 of the APS system 100 in that column decoder 450 is programmed to operate so that signals can be read from more than one column buffer circuit 432, 434, 436 at substantially the same time. That is, for example, respective sets of output signals from two or more output buffers e.g., 434, 436 may be applied substantially simultaneously to the differential inputs of the gain stage 455.

Figure 4:
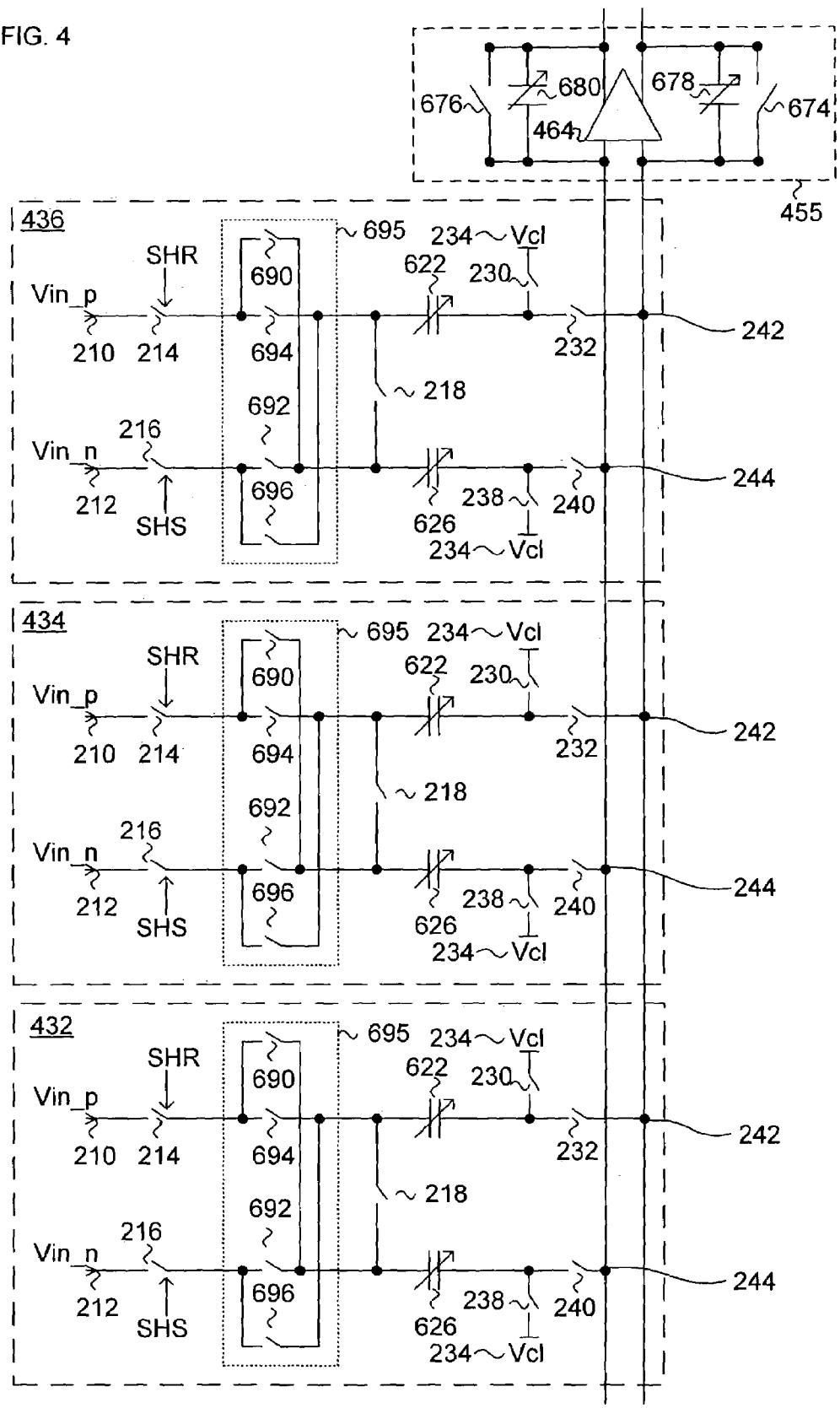
FIG. 4 shows a portion of the FIG. 3 block diagram in greater detail.

FIG. 4 shows the column buffer circuits 432, 434, 436 and gain stage 455 of the FIG. 3 APS system 400 in greater detail. The column buffer circuit 436, which is representative of column buffer circuits 432, 434, differs from the column buffer circuit 136 (FIG. 2) by including a polarity reversing circuit 695 for use in the subtraction operation described in greater detail below. Further, the column buffer circuit 436 differs from the column buffer circuit 136 (FIG. 2) by including variable capacitors 622, 626 for use in the average and weighted sum operation described in greater detail below. The gain stage 455 differs from the gain stage 155 (FIG. 2) by including variable capacitors 678, 680 for use in the average and weighted sum operation described in greater detail below.

In the column buffer circuit 436 shown in FIG. 4, the first input node 210 receives reset voltage Vin_p and is coupled to a first terminal of a first sampling switch 214. Switch 214, and the other switches within the FIG. 4 circuit, is typically implemented as MOSFETs. The second input node 212 receives signal voltage Vin_n and is coupled to a first terminal of a second sampling switch 216. The first switch 214 has a second terminal mutually coupled to a first terminal of a switch 690 and a first terminal of a switch 694 of the polarity reversing circuit 695. The second switch 216 has a second terminal mutually coupled to a first terminal of a switch 692 and a first terminal of a switch 696 of polarity reversing circuit 695.

Switch 694 has a second terminal mutually coupled to a first terminal of a crawbar switch 218 and a first terminal of a sample-and-hold variable capacitor 622. Switch 690 has a second terminal mutually coupled to a second terminal of crawbar switch 218 and a first terminal of a sample-and-hold variable capacitor 626. Switch 696 has second terminal mutually coupled to a first terminal of crawbar switch 218 and a first terminal of sample-and-hold capacitor 622. Switch 692 has second terminal mutually coupled to a second terminal of crawbar switch 218 and a first terminal of sample-and-hold capacitor 626.

The reverse polarity circuit 695 directs the storage of the set of signals Vrst, Vsig to capacitors 622, 626. When the reverse polarity circuit 695 operates in a standard, normal, or non-inverting, mode, the Vin_p signal carried on line 210 is stored on capacitor 622 and the Vin_n signal carried on line 212 is stored on capacitor 626. When the reverse polarity circuit 695 operates in a reversing, or inverting, mode, (e.g., in the subtraction operation) the Vin_p signal carried on line 210 is stored on capacitor 626 and the Vin_n signal carried on line 212 is stored on capacitor 622. In another embodiment, the reverse polarity circuit 695 is disposed between the respective capacitors 622, 626 and the respective nodes 242, 242 and permits inverting the polarity of the signals after storing the signals in the respective capacitors and before reaching the nodes 232, 240. In another aspect, the reverse polarity circuit 695 may not be included in an APS systems 400 in which there is no desire to perform a subtraction operation.

Still referring to FIG. 4, a second terminal of the first sample and hold capacitor 622 is mutually coupled to a first terminal of a first clamping switch 230 and to a first terminal of a select switch 232. A second terminal of the second sample and hold capacitor 626 is mutually coupled to a first terminal of a second clamping switch 238 and to a first terminal of a second select switch 240. The respective second terminals of the first and second clamping switches 230, 238 are coupled to a source of a clamping voltage Vcl. The respective second terminals of the first and second select switches 232, 240 are coupled to respective output nodes 242, 244 of the buffer circuit 436.

A column decoder circuit 450 (as shown in FIG. 3) controls the operation of the switches (214, 216, 218, 230, 232, 238, 240) of the buffer circuit 436. The output nodes 242, 244 of the buffer circuit 436 are coupled respectively to first and second inputs of gain stage 455. The gain stage 455 contains a differential amplifier 464, variable feedback capacitors 678, 680, and switches 674, 676. Differential amplifier 464 receives a set of signals from a plurality of pixel cells and outputs differential voltages of the received signals.

The variable capacitors 622, 626 of the column buffer circuits 432, 434, 436 and the variable capacitors 678, 680 of the gain stage 455 of FIG. 4 are used to implement a gain in the signals carried between the capacitors in a conventional manner. For instance, the signal gain is equivalent to the ratio between the capacitance value (e.g., Csi) of the variable capacitors 622, 626 of the column buffer circuits 432, 434, 436 and the capacitance value of the variable capacitors 678, 680 of the gain stage 455, i.e., (e.g., Cf). Therefore, the gain is Csi/Cf.

Figure 5:
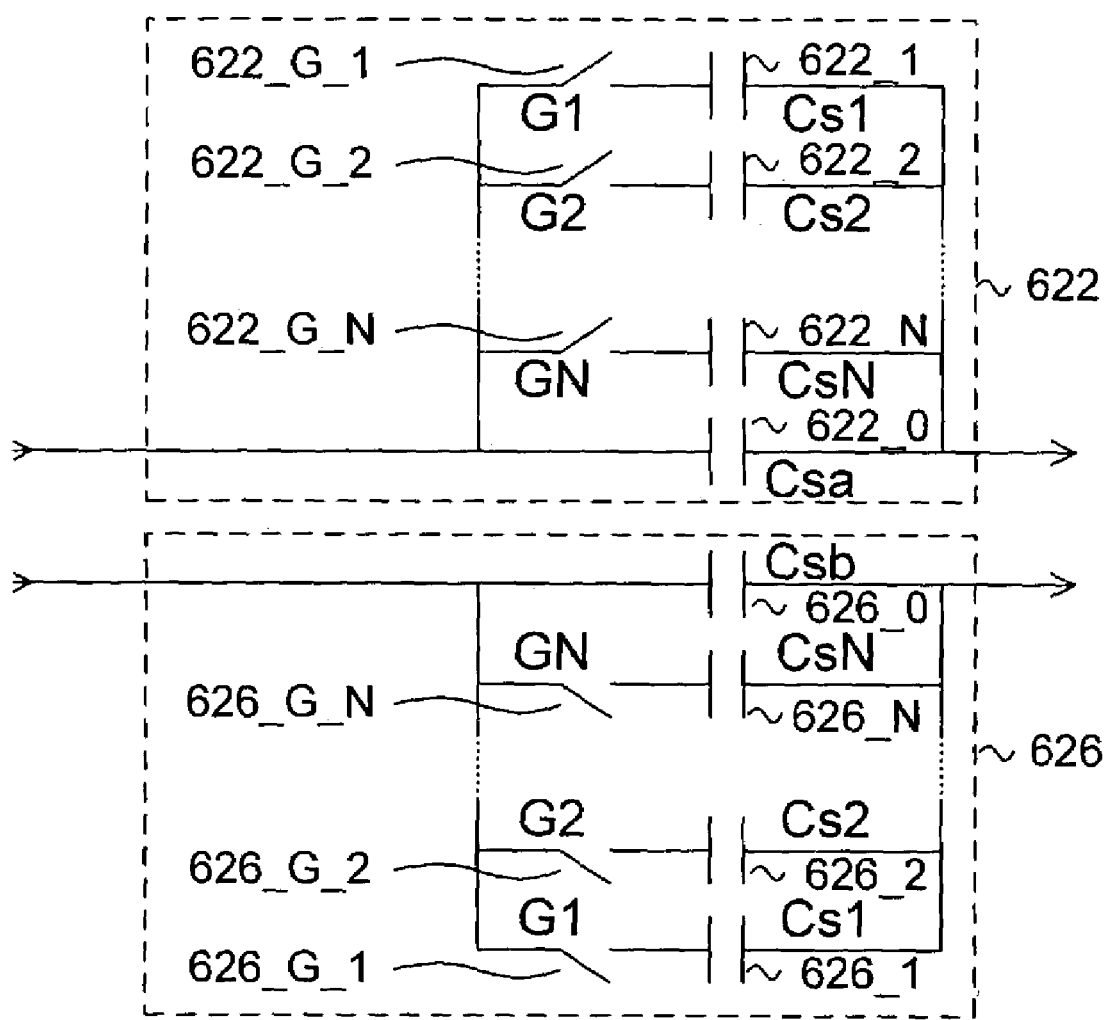
FIG. 5 shows another portion of the FIG. 3 block diagram in greater detail.

FIG. 5 shows the sample-and-hold variable capacitors 622, 626 (of FIG. 4) in greater detail. Each variable capacitor 626, 622 contains a plurality of substantially similar, switchably coupled, parallel connected capacitors. Variable capacitor 626 has a capacitor 626_0 switchably connected in parallel with capacitors 626_1, 626_2, . . . 626_N through respective switches 626_G_1, 626_G_2, . . . 626_G_N. The capacitance of the variable capacitor 626 is thereby controlled by selectively closing a desired combination of switches 626_G_1, 626_G_2, . . . 626_G_N. Variable capacitor 622 performs similarly to variable capacitor 626. In another aspect, variable capacitors 622, 626 may not be included in an APS systems 400 in which there is no desire to perform average and weighted sum operations.

Figure 6:
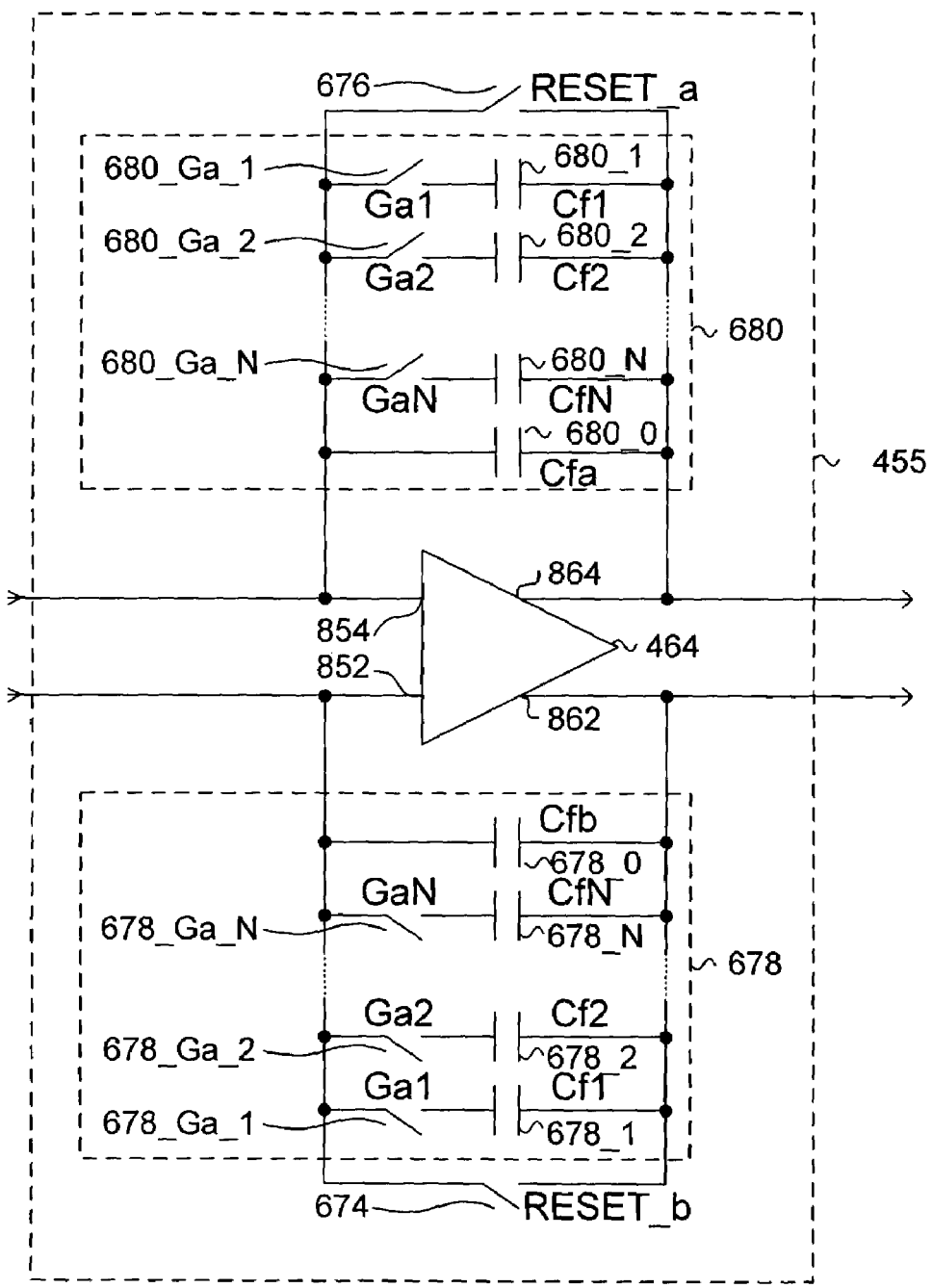
FIG. 6 shows yet another portion of the FIG. 3 block diagram in greater detail.

FIG. 6 shows the gain stage 455 and variable capacitors 680, 678 (of FIG. 4) in greater detail. First and second outputs 862, 864 of the gain stage amplifier 464 are respectively fed back to gain stage amplifier 464 inputs 852, 854 through respective parallel combinations of reset switches 674, 676 and variable feedback capacitors 678, 680. Each variable feedback capacitor 678, 680 contains of a plurality of switchably coupled parallel connected, substantially similar capacitors. Variable capacitor 678 has a capacitor 678_0 switchably connected in parallel with capacitor 678_1, 678_2, . . . 678_N through respective switches 678_Ga_1, 678_Ga_2, . . . 678_Ga_N. The capacitance of the variable capacitor 678 is controlled by selectively closing any combination of switches 678_Ga_1, 678_Ga_2, . . . 678_Ga_N. Similarly, variable capacitor 680 has a capacitor 680_0 switchably connected in parallel with capacitor 680_1, 680_2, . . . 680_N through respective switches 680_Ga_1, 680_Ga_2, . . . 680_Ga_N. In another aspect, variable capacitors 680 may not be included in an APS systems 400 in which there is not desire to perform average and weighted sum operations.

Figure 1:
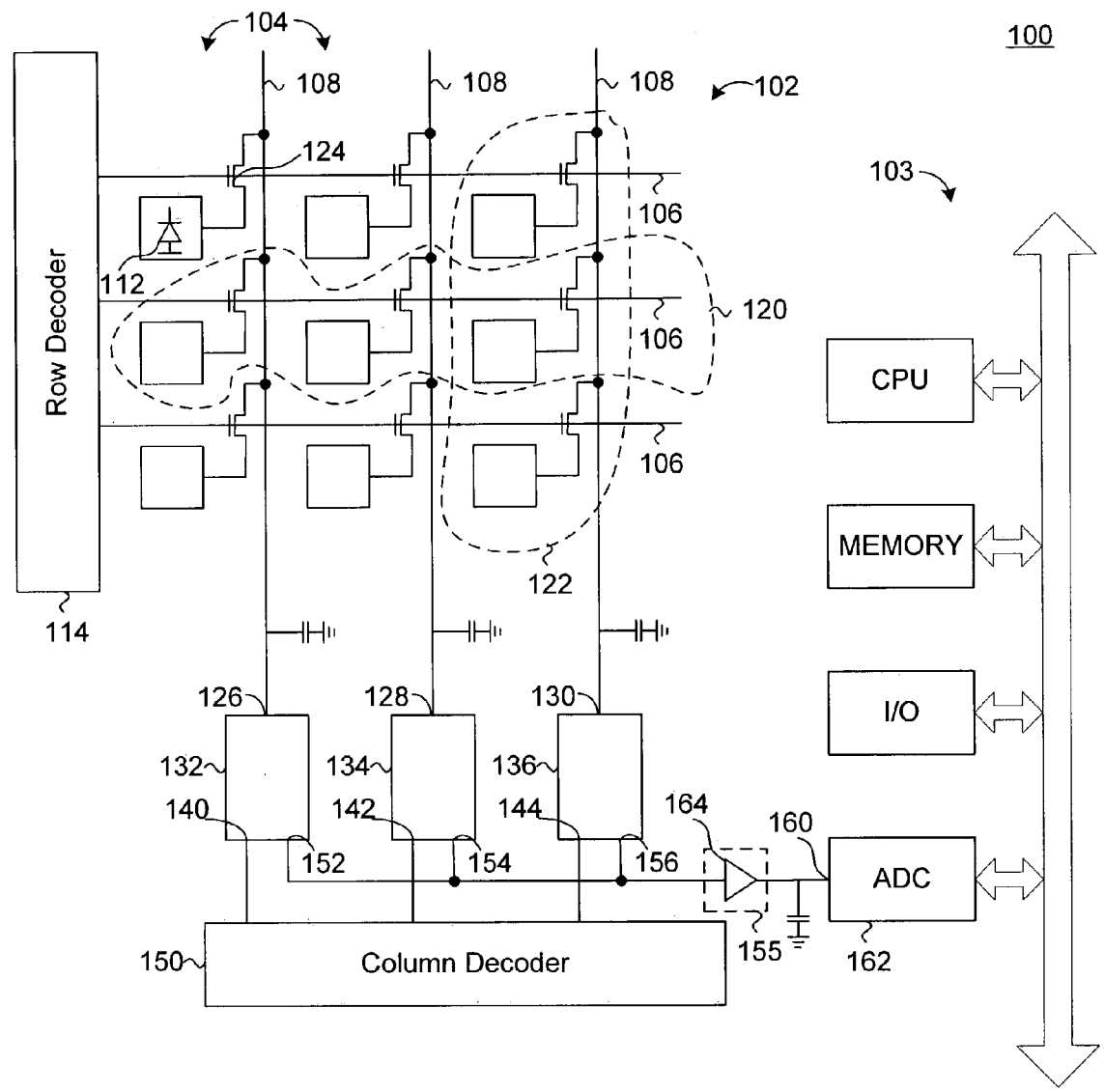
FIG. 1 shows a conventional APS array and associated processing circuitry.
Figure 2:
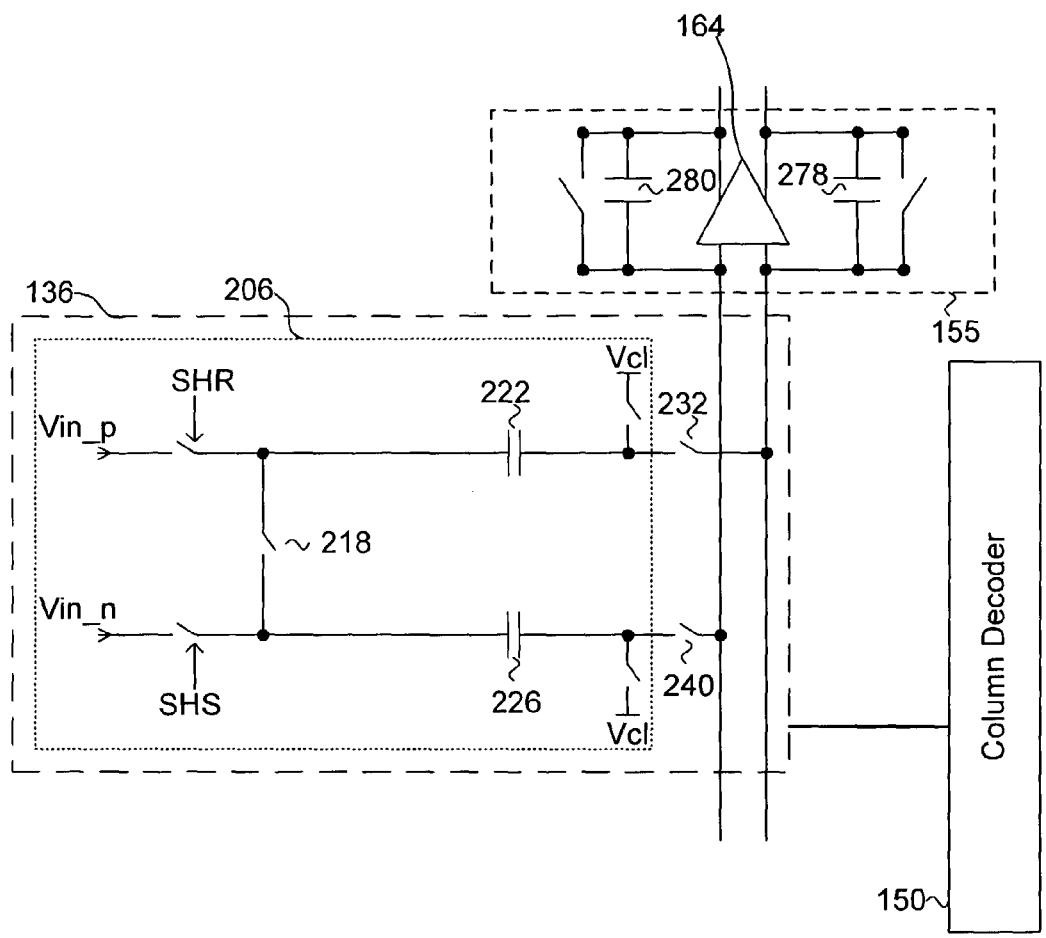
FIG. 2 shows a portion of the FIG. 1 block diagram in greater detail.

An APS system 400, as shown in FIGS. 3-6, can combine at least two sets of pixel signals received from different column buffer circuits 432, 434, 436 in the charge domain prior to the signals being digitized. The differential output of a conventional APS system 100 is described above in Eq. (1). The present invention, which combines sets of signals received from at least two column buffer circuits, provides the following output signal:

$$Vout = \sum_{i}^{N} [\alpha_i C s_i / C f (\text{Vin\_p} - \text{Vin\_n}), i] \quad (2)$$

$$= \sum_{i}^{N} [\alpha_i C s_i / C f (V diff_i)] \quad (3)$$

i corresponds to the number of column buffer circuits that are combined and can range from i=1 (e.g., a single column buffer circuit) to i=N (e.g., any number of column buffer circuits). (FIG. 2.)

$\alpha_i$ represents the polarity of the $i^{th}$ column buffer circuit and is either 1 or −1. If $\alpha_i$=1, then the polarity of the signals is normal. For example, when a column buffer circuit 436 has a normal polarity, then a signal Vin_p carried at input 210 would be stored on capacitor 622 and a signal Vin_n carried at input 212 would be stored on capacitor 626. If $\alpha_i$=−1, then the polarity of the signals are inverted. For example, when a column buffer circuit 436 has a reverse polarity, then a signal Vin_p carried at input 210 would be stored on capacitor 626 and a signal Vin_n carried at input 212 would be stored on capacitor 622. For example, during a subtraction operation a first set of signals is subtracted from a second set of signals. To implement this operation the first set of signals is 'negatived' and added to the second set of signals. The first set of signals is 'negatived' by inverting the polarity of the first set of signals (i.e., reversing the Vin-p and Vin-n signals), which is represented in Eq. 3 by the α of the first set of signals being equivalent to "−1").

$Cs_i$ corresponds to the capacitance of capacitors 622, 626 of the $i^{th}$ column buffer circuit. Cf corresponds to the capacitance of feedback capacitors 680, 678 of the gain stage circuit 455.

$Vdiff_i$ corresponds to the differential output of a differential amplifier receiving a set of signals from the $i^{th}$ column buffer.

To implement an addition operation on a plurality of sets of signals received from a plurality of column buffer circuits, the signals stored in respective capacitors 622 from the selected columns buffer circuits are combined in the gain stage circuit 455, and the signals stored in respective capacitors 626 from the selected columns buffer circuits are combined in the gain stage circuit 455. The signals stored in respective capacitors 622 from the selected columns buffer circuits are combined by coupling the respective capacitors 622 at substantially the same time to each other and also each variable capacitor 678 from gain circuit 455. Similarly, the signals stored in respective capacitors 626 from the selected columns buffer circuits are combined by coupling the respective capacitors 626 at substantially the same time to each other and also to variable capacitor 680 from gain circuit 455.

For example, all the selected Vin_p signals are combined and all the selected Vin_n signals are combined. Based on Eq. 2, $\alpha_i=1$, i.e., no reverse polarity, and $Cs_i=Cf$. (i.e., no gain between capacitors), then:

$$Vout = \sum_i^N [\alpha_i Cs_i / Cf (\text{Vin\_p} - \text{Vin\_n}), i] \quad (4)$$
$$= \sum_i^N [(\text{Vin\_p} - \text{Vin\_n}), i]$$
$$= \sum_i^N Vdiff_i$$

Therefore, the output of the gain stage 455 is the difference between the combined signals, i.e., the difference between the combined signals from respective capacitors 622 and the combined signals from respective capacitors 626 that are input to the gain stage 455.

To implement a subtraction operation, a set of signals received from a first selected column buffer circuit(s) are combined with a set of inverted signals received from a second selected column buffer circuit. For example, to subtract signals stored in column buffer circuit 434 from the signals stored in column buffer circuit 436, the signals stored in column buffer circuit 434 are inverted when they are stored. For instance, the Vin_p input at 210 is stored on capacitor 626 of column buffer circuit 434 and the Vin_n input at 212 is stored on capacitor 622 of column buffer circuit 434.

The signals stored in column buffer circuit 436 are not inverted when they are stored. The Vin_p input at 210 is stored on capacitor 622 of column buffer circuit 436 and the Vin_n input at 212 is stored on capacitor 626 of column buffer circuit 436. Therefore, when the sets of signals received from the column buffer circuits 434, 436 are combined in the gain stage 455, Vin_p of column buffer circuit 436 stored on capacitor 622 is combined with Vin_n of column buffer circuit 434 stored on capacitor 622. And Vin_n of column buffer circuit 436 stored on capacitor 626 is combined with Vin_p of column buffer circuit 434 stored on capacitor 626. With reference to Eq. 2, $\alpha_i=-1$, e.g., inverted polarity where the differential output of the $i^{th}$ column buffer circuit is sought to be reversed (i.e., negatived) (e.g., if column buffer circuit 434 corresponds to i=1 and column buffer circuit 436 corresponds to i=2, then $\alpha_1=-1$ and $\alpha_2=1$), and $Cs_i=Cf$; e.g., no gain between capacitors, and N=2 (i.e., since there are two column buffer circuits 434, 436 that are being combined), then:

$$Vout = \sum_i^N [\alpha_i Cs_i / Cf (\text{Vin\_p} - \text{Vin\_n}), i] \quad (5)$$
$$= \sum_i^N [(\text{Vin\_p} - \text{Vin\_n}), i]$$
$$= Vdiff_1 - Vdiff_2$$

Therefore the output of the gain stage 455 is the difference between the combined signals, i.e., the difference between the signals from column buffer circuit 434 and the signals from column buffer circuit 436. The difference is determined between the combined signals by combining the signals in two groups, where the first group of combined signals constitutes Vin_p of column buffer circuit 436 stored on capacitor 622 and Vin_n of column buffer circuit 434 stored on capacitor 622 (i.e., combining the signals received from respective capacitors 622) and the second group of combined signals constitutes Vin_n of column buffer circuit 436 stored on capacitor 626 and Vin_p of column buffer circuit 434 stored on capacitor 626 (i.e., combining the signals received respective capacitors 626). And then determining the difference between the two groups.

To implement an average operation, similar to an addition operation, the signals stored in respective capacitors 622 from the selected columns are combined in the gain stage circuit 455, and the signals stored in respective capacitors 626 from the selected columns are combined in the gain stage circuit 455. Additionally, the capacitance of the respective sampling capacitor 622, 626 is established as a ratio of a respective feed back capacitor 678, 680.

For example, all of the selected Vin_p signals are combined, all of the selected Vin_n are combined, then a difference of all of the combined signals is determined. Each respective signal, e.g., Vin_p, Vin_n, is weighted relative to the number of column buffer circuits being averaged. With reference to Eq. 2, $\alpha_i=1$, (i.e., no inverted polarity), and $Cs_i=1/N\ (Cf)$, where N is the number of column buffer circuits being averaged, then:

$$Vout = \sum_i [\alpha_i Cs_i / Cf (\text{Vin\_p} - \text{Vin\_n}), i] \quad (6)$$
$$= \sum_i [(1/N)(Cf)(\text{Vin\_p} - \text{Vin\_n}), i]$$
$$= 1/N \sum_i Vdiff_i$$

Therefore the output of the gain stage 455 is the difference between the combined signals divided by the number of column buffer circuits that are combined, i.e., the difference between the combined signals received from respective capacitors 622 and the combined signals received from respective capacitors 626 that are input to the gain stage divided by the number of column buffer circuits that are combined. A differential amplifier receives the combined values in two groups (e.g., the first group being the combined signals received from capacitors 622, the second group being the combined signals received from capacitors 626) and provides a differential output of these two groups of signals.

Implementing a weighted sum operation is similar to implementing an average operation, however, the biasing potential of the variable capacitors is used. In the weighted sum operation, $Cs_i=W_i\ (Cf)$, where $W_i$ is the weight factor of the $i^{th}$ column buffer circuit:

$$Vout = \sum_i [\alpha_i Cs_i / Cf (\text{Vin\_p} - \text{Vin\_n}), i] \quad (7)$$
$$= \sum_i [(W_i)(\text{Vin\_p} - \text{Vin\_n}), i]$$
$$= \sum_i W_i (Vdiff_i)$$

Therefore, the output of the gain stage 455 is the weighted difference between the combined signals, i.e., the difference between the combined signals from respective capacitors 622 and the combined signals from respective capacitors 626 that are input to the gain stage and weighted by the ratio of the respective variable capacitors 622 and 678 or 626 and 680.

Figure 7:
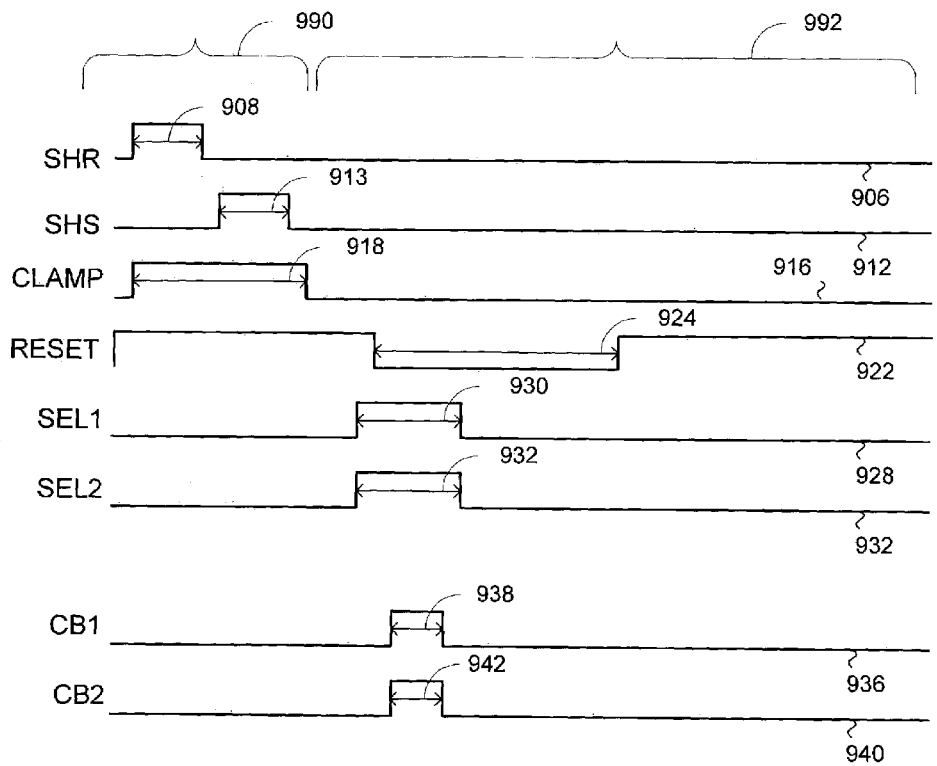
FIG. 7 shows a timing diagram for implementing an addition operation with the APS array and associated processing circuitry of FIGS. 3-6.

Turning to FIG. 7 an addition operation implemented by the operation of the FIGS. 3-6 circuits is now described. In this example, it is assumed that the values stored by the column buffer circuit 434 are being combined with the values stored by the column buffer circuit 436.

With reference to FIG. 7, various signals are shown over two defined time intervals 990, 992. The first time interval 990 is a sample and hold time interval. During sample and hold time interval 990 the sampling capacitors 622, 626 of each respective column buffer circuit 434, 436 are charged with respect to the clamp voltage to the respective voltages present at the first and second inputs 210, 212 of the respective column buffer circuit 434, 436.

The second time interval 992 is a read out time interval. During the read out time interval 992 the sampling capacitors 622, 626 of column buffer circuit 434 are transferred to the respective inputs of the gain stage 455 through respective selection switches 232, 240 of column buffer circuit 434. Also during the read out time interval 992 the sampling capacitors 622, 626 of column buffer circuit 436 are transferred to the respective inputs of the gain stage 455 through respective selection switches 232, 240 of column buffer circuit 436. In the gain stage 455 the set of signals received from column buffer circuit 436 is combined with the set of signals received from column buffer circuit 434.

Throughout FIG. 7 a logic high signal indicates that a corresponding switch of FIGS. 3-6 is closed (conductive), while a logic low signal indicates that the corresponding switch of FIGS. 3-6 is open (non-conductive). Signal 906 SHR corresponds to the state of sampling switch 214 in both column buffer circuits 434, 436. Signal 912 SHR corresponds to the state of sampling switch 216 in both column buffer circuits 434, 436. Signal 916 CLAMP corresponds to the state of clamp voltage switches 230 and 238 in both column buffer circuits 434, 436. Signal 922 RESET corresponds to the state of reset switches 674, 676. Signal 928 SEL1 corresponds to the state of selection switches 232 and 240 in column buffer circuit 434. Signal 932 SEL2 corresponds to the state of selection switches 232 and 240 in column buffer circuit 436. Signal 936 CB1 corresponds to the state of crawbar switch 218 in column buffer circuit 434. Signal 940 CB2 corresponds to the state of crawbar switch 218 in column buffer circuit 436.

No signals are shown for variable capacitors 622, 626, 678, 680 in the example provided because no variability in the variable capacitors 622, 626, 678, 680 is being demonstrated. Furthermore, in the addition operation being illustrated, the reverse polarity circuit 695 does not invert the polarity of any signals. Therefore, switches 692, 694 are closed and conducting, and switches 690, 696 are open and non-conducting.

As indicated in FIG. 7, initially all switches are open (non-conductive) except for reset switches 674 and 676. During a time interval 918, the CLAMP signal goes logic high and switches 230 and 238 close to charge capacitors 622 and 626 in each respective column buffer circuit 434, 436 to the clamp voltage supplied by clamp voltage source 234. While the clamp switches 230, 238 in each respective column buffer circuit 434, 436 are closed, sampling switch 214 in each respective column buffer circuit 434, 436 closes for a first time interval 908 and, subsequently, sampling switch 216 in each respective column buffer circuit 434, 436 closes for a second time interval 913. As a result, the other side of capacitors 622 and 626 in each column buffer circuit is charged to the respective voltage levels of Vin_p and Vin_n.

Selection switches 232 and 240 in column buffer circuit 434 then close for the duration of time interval 930. At substantially the same time, during time interval 932, selection switches 232 and 240 in column buffer circuit 436 close. During time intervals 930 and 932, reset switches 674 and 676 open, and remain open for a time interval 924 that extends until a time after the end of time interval 930 and 932. Shortly after the reset switches 674 and 676 open, and while the selection switches 232, 240 of both column buffer circuits 434, 436 are closed, crawbar switches 218 in column buffer circuits 434, 436 close at substantially the same time for respective time intervals 938, 942. Time intervals 938, 942 end prior to the end of respective time interval 930, 932.

Summarizing the FIG. 7 cycle, during the sample and hold time interval 990, Vsig and Vrst signals are acquired from a pixel cell 104 and stored on first and second sampling capacitors 622, 626 in column buffer circuit 436. Also during the sample and hold time interval 990, Vsig and Vrst signals are acquired from a different pixel cell 104 and stored on first and second sampling capacitors 622, 626 in column buffer circuit 434.

During read out time interval 992, the set of signals received from the column buffer circuit 436 is combined with the set of signals received from the column buffer circuit 434 in the gain stage 455.

Figure 8:
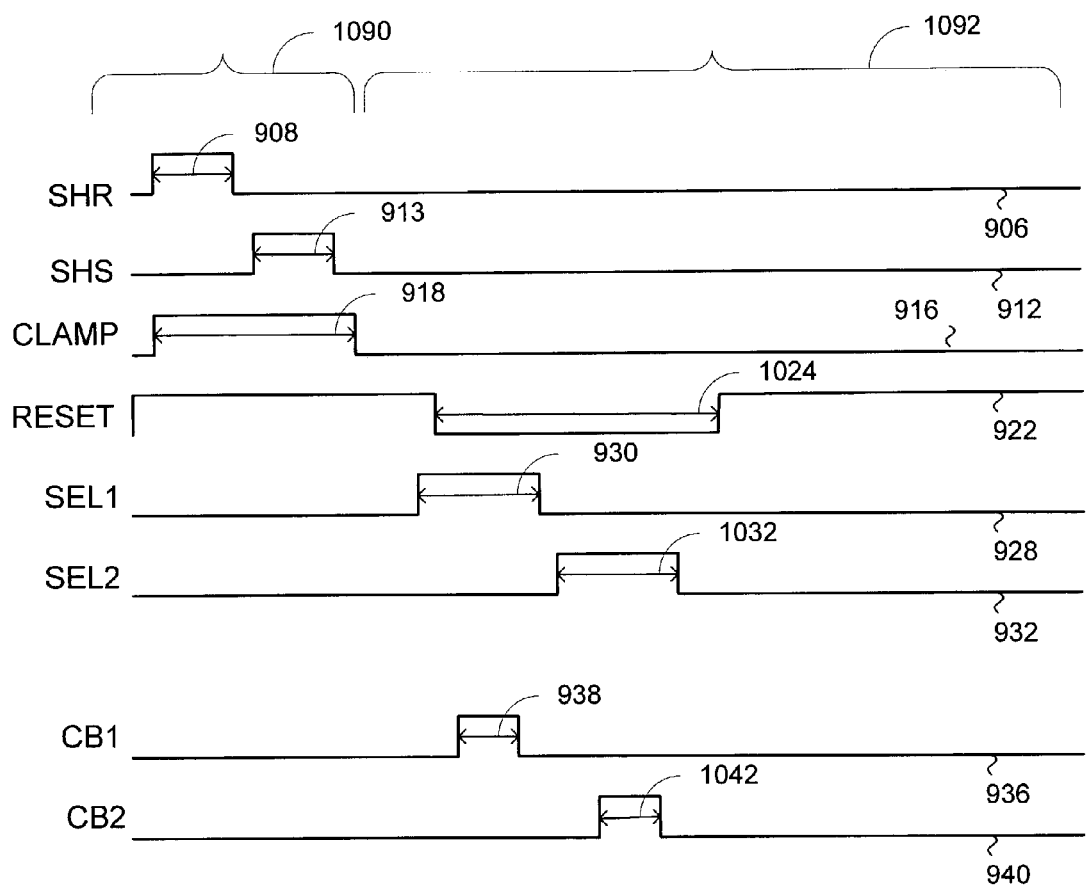
FIG. 8 shows another timing diagram for implementing an addition operation with the APS array and associated processing circuitry of FIGS. 3-6.

FIG. 8 shows another timing diagram for implementing an addition operation with the APS array and associated processing circuitry of FIGS. 3-6. The operation of FIG. 8 differs from the operation of FIG. 7 in that the signals SEL, CB are staggered.

Figure 9:
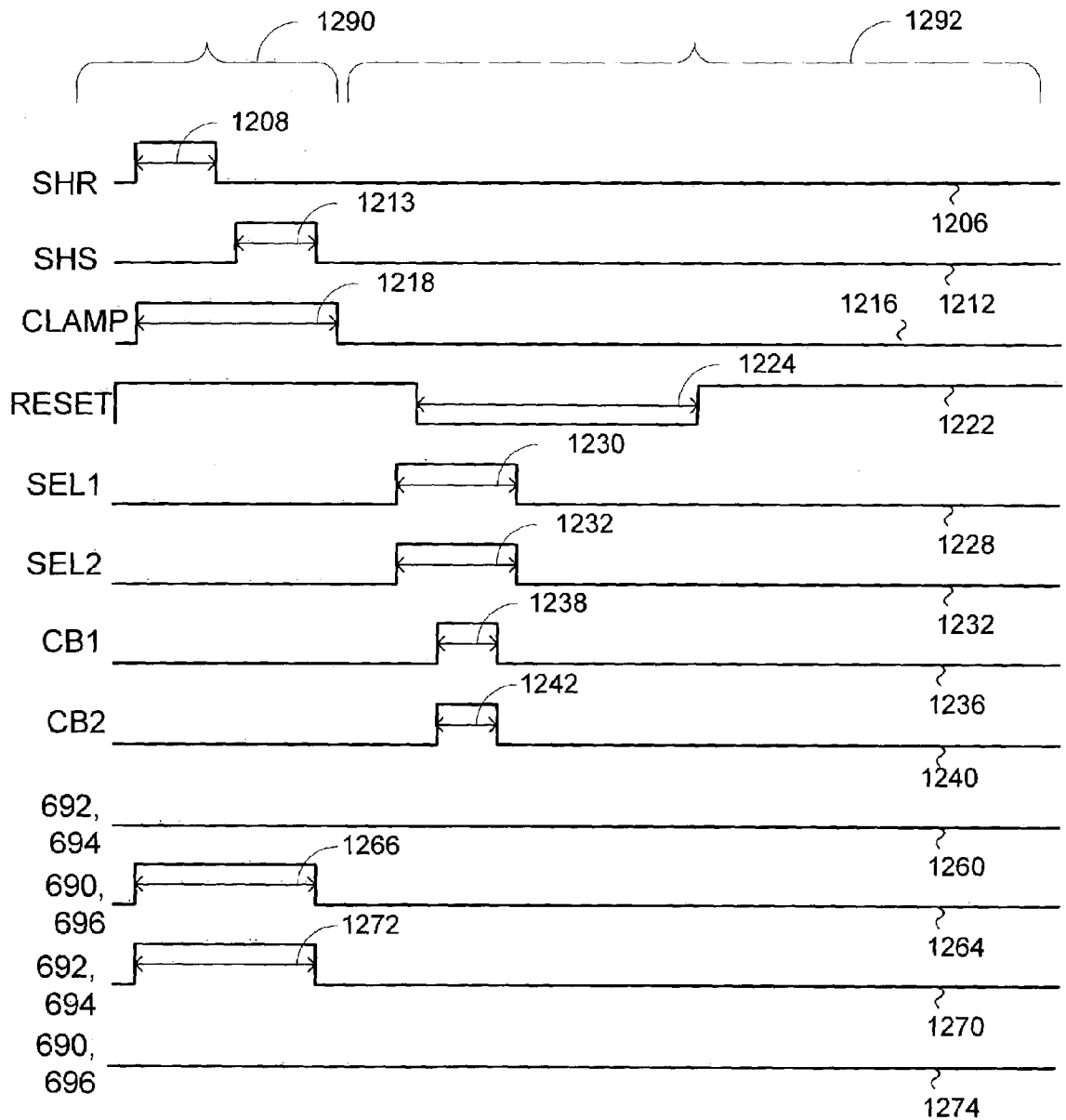
FIG. 9 shows a timing diagram for implementing a subtraction operation with the APS array and associated processing circuitry of FIGS. 3-6.

Turning to FIG. 9 a subtraction operation implemented by the operation of the FIGS. 3-6 circuits is now described. In this example, it is assumed that the values stored by the column buffer circuit 434 are being subtracted from the values stored by the column buffer circuit 436. The FIG. 9 subtraction operation is similar to the FIG. 7 addition operation except that the reverse polarity circuit is utilized.

Signal 1260 corresponds to the state of switches 692, 694 in column buffer circuit 434 and signal 1264 corresponds to the state of switches 690, 696 in column buffer circuit 434. Signal 1270 corresponds to the state of switches 692, 694 in column buffer circuit 436 and signal 1274 corresponds to the state of switches 690, 696 in column buffer circuit 436.

As indicated in FIG. 9, initially all switches are open (non-conductive) except for reset switches 674 and 676. During a time interval 1218 the CLAMP signal goes logic high and clamp switches 230 and 238 close to charge capacitors 622 and 626 in each respective column buffer circuit 434, 436 to the clamp voltage supplied by clamp source 234. While the clamp switches 230, 238 in each respective column buffer circuit 434, 436 are closed, sampling switch 214 in each respective column buffer circuit 434, 436 closes for a first time interval 1208 and, subsequently, sampling switch 216 in each respective column buffer circuit 434, 436 closes for a second time interval 1213.

While the clamp switches 230, 238 in each respective column buffer circuit 434, 436 are closed, switches 690, 696 in column buffer circuit 434 and switches 692, 694 in column buffer circuit 436 close for representative time intervals 1266, 1272. Time intervals 1266, 1272 begin before time intervals 1208, 1213 begin and ending after time intervals 1208, 1213 end. Thereafter, both clamping switches 230, 238 in each respective column buffer circuit 434, 436 open. As a result, the other side of capacitors 622 and 626 in column buffer circuit 436 are charged to the respective voltage levels of Vin_p and Vin_n. And correspondingly, the other side of capacitors 622 and 626 in column buffer circuit 434 are charged to the respective voltage levels of Vin_n and Vin_p.

Selection switches 232 and 240 in column buffer circuit 434 close for the duration of time interval 1230. Selection switches 232 and 240 in column buffer circuit 436 close for the duration of time interval 1232. During time interval 1230 and 1232, reset switches 674 and 676 open, and remain open for a time interval 1224 that extends until a time after the end of time interval 1230 and 1232. Shortly after the reset switches 674 and 676 open, crawbar switches 218 in column buffer circuits 434, 436 close for respective time intervals 1238, 1242 that ends prior to the end of respective time interval 1230, 1232.

Summarizing the FIG. 9 cycle, during the sample and hold time interval 1290, Vsig and Vrst signals are acquired from a pixel cell 104 and respectively stored on first and second sampling capacitors 626, 622 in column buffer circuit 436 respectively. Also during the sample and hold time interval 1290, Vrst and Vsig signals are acquired from a different pixel cell 112 and respectively stored on first and second sampling capacitors 626, 622 in column buffer circuit 434 respectively.

During read out time interval 1292, the values stored on first sampling capacitors 622, in column buffer circuits 436 and 434 are combined by the closure of the crawbar switch 218 in each respective column buffer circuit 436, 434, and applied to the respective input of the gain stage 455. Also during read out time interval 1292, the values stored on second sampling capacitors 626, in column buffer circuits 436 and 434 are combined by the closure of the crawbar switch 218 in each respective column buffer circuit 436, 434, and applied to the respective input of the gain stage 455. Thus, the set of signals received from the column buffer circuit 434 is subtracted from the set of signals received from the column buffer circuit 436 in the gain stage 455.

Figure 10:
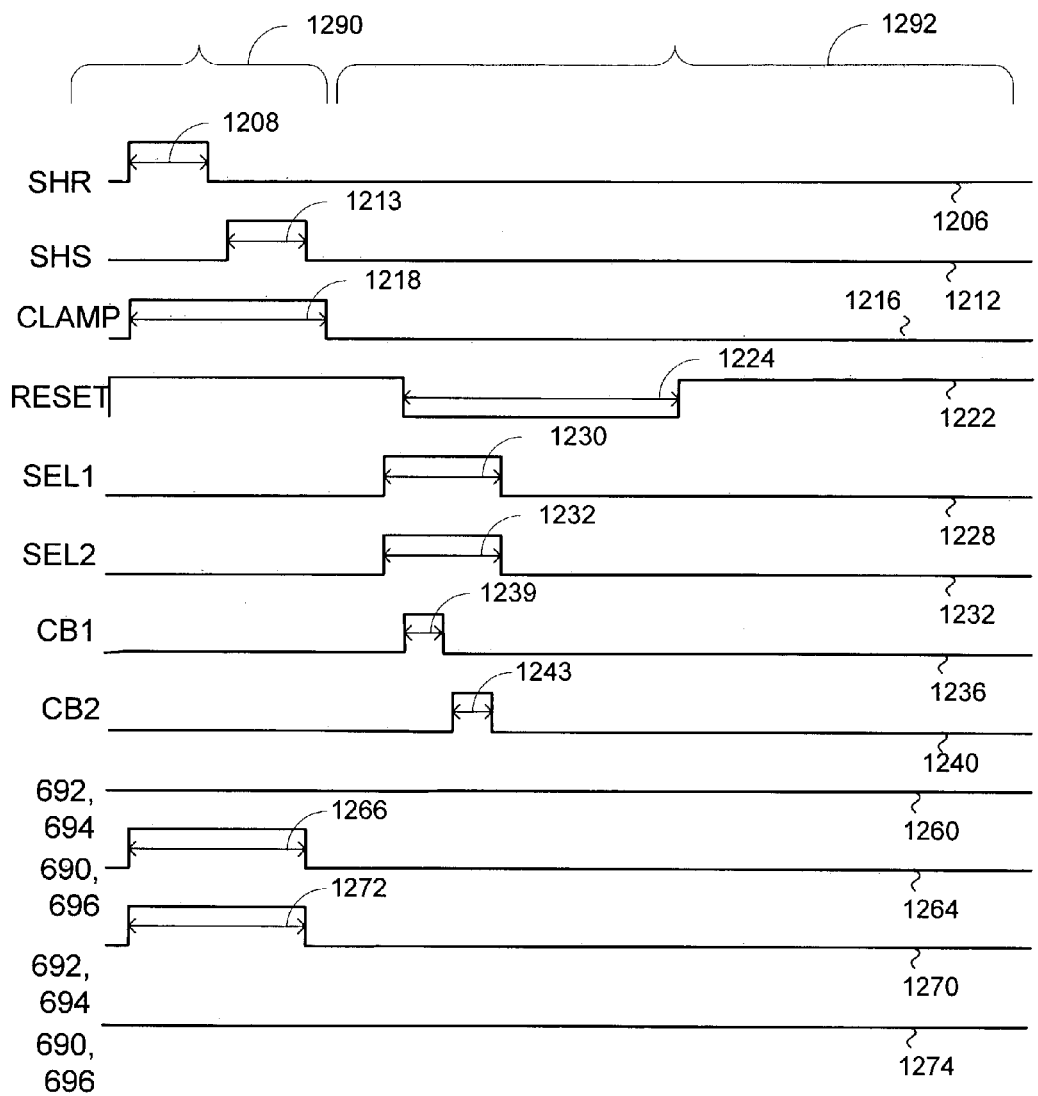
FIG. 10 shows another timing diagram for implementing a subtraction operation with the APS array and associated processing circuitry of FIGS. 3-6.

FIG. 10 shows another subtraction operation implemented by the operation of the FIGS. 3-6 circuits. The operation of FIG. 10 differs from the operation of FIG. 9 in that the signals SEL, CB are staggered.

Figure 11:
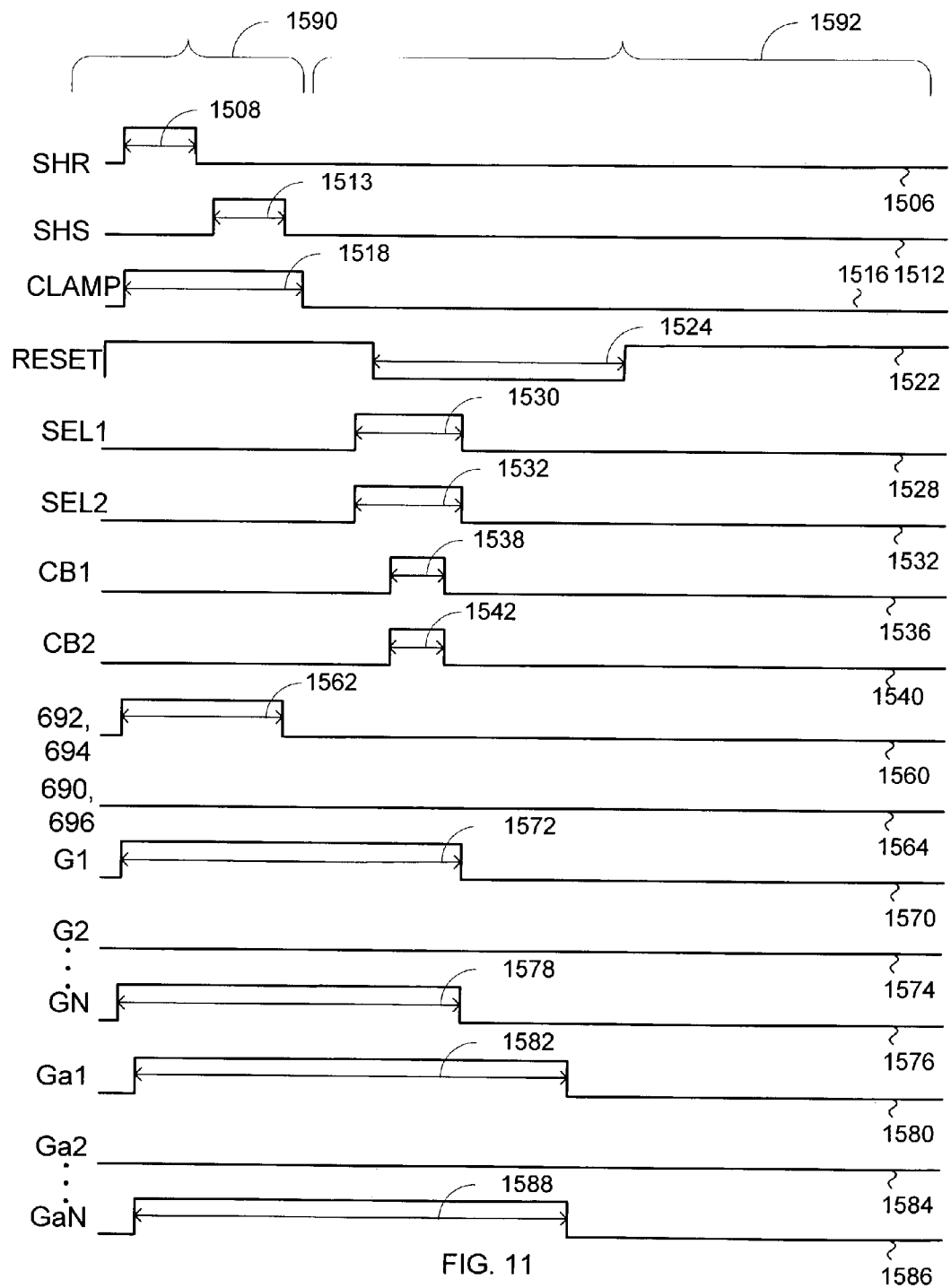
FIG. 11 shows a timing diagram for implementing an average operation with the APS array and associated processing circuitry of FIGS. 3-6.

Turning to FIG. 11 an average operation implemented by the operation of the FIGS. 3-6 circuits is now described. In this example, it is assumed that the values received from column buffer circuit 434 are being averaged with the values received from column buffer circuit 436. The FIG. 11 average operation is similar to the FIG. 7 addition operation except that the variable capacitors (680, 678 of FIG. 6) are enabled. The capacitance values of the variable capacitors are established such that each respective variable capacitor $C_{si}=(1/N)$ $C_f$.

Signal 1560 corresponds to the state of switches 692, 694 in both buffer column circuits 434, 436. Signal 1564 corresponds to the state of switches 690, 696 in both buffer column circuits 434, 436. Signal 1570 G1 corresponds to the state of switch G1 in both buffer column circuits 434, 436. Signal 1574 G2 corresponds to the state of switch G2 in both buffer column circuits 434, 436. Signal 1576 GN corresponds to the state of switch GN in both buffer column circuits 434, 436. Signal 1580 Ga1 corresponds to the state of switches Ga1 in gain stage 455. Signal 1584 Ga2 corresponds to the state of switches Ga2 in gain stage 455. Signal 1586 GaN corresponds to the state of switches GaN in gain stage 455.

As indicated in FIG. 11, initially all switches are open (non-conductive) except for reset switches 674 and 676. During a time interval 1518 the CLAMP signal goes logic high and switches 230 and 238 close to charge capacitors 622 and 626 in each respective column buffer circuit 434, 436 to the CLAMP voltage supplied by clamp voltage source 234. While the clamp switches 230, 238 in each respective column buffer circuit 434, 436 are closed, sampling switch 214 in each respective column buffer circuit 434, 436 closes for a first time interval 1508 and, subsequently, sampling switch 216 in each respective column buffer circuit 434, 436 closes for a second time interval 1513. While the clamp switches 230, 238 in each respective column buffer circuit 434, 436 are closed, switches 692, 694 in column buffer circuit 436 close for time interval 1562 beginning before time intervals 1508, 1513 begin and ending after time intervals 1508, 1513 end. Thereafter, both clamping switches 230, 238 in each respective column buffer circuit 434, 436 open. As a result, the other side of capacitors 622 and 626 in column buffer circuits 434, 436 are charged to the respective voltage levels of Vin_p and Vin_n.

Selection switches 232 and 240 in column buffer circuit 434 then close for the duration of time interval 1530. During the time interval 1532 selection switches 232 and 240 in column buffer circuit 436 close at substantially the same time. During time intervals 1530 and 1532, reset switches 674 and 676 open, and remain open for a time interval 1524 that extends until a time after the end of time interval 1530 and 1532. Shortly after the reset switches 674 and 676 open, and while the selection switches 232, 240 of both column buffer circuits 434, 436 are closed, crawbar switches 218 in column buffer circuits 434, 436 close at substantially the same time for respective time intervals 1538, 1542. The time intervals 1538, 1542 end prior to the end of respective time interval 1530, 1532.

Summarizing the FIG. 11 cycle, during the sample and hold time interval 1590, Vsig and Vrst signals are acquired from a pixel cell 104 and stored on first and second variable sampling capacitors 622, 626 in column buffer circuit 436. Also during the sample and hold time interval 1590, Vrst and Vsig signals are acquired from a different pixel cell 104 and stored on first and second variable sampling capacitors 622, 626 in column buffer circuit 434. During read out time interval 1592, the set of signals received from the column buffer circuit 434 is averaged with the set of signals received from the column buffer circuit 436.

Figure 12:
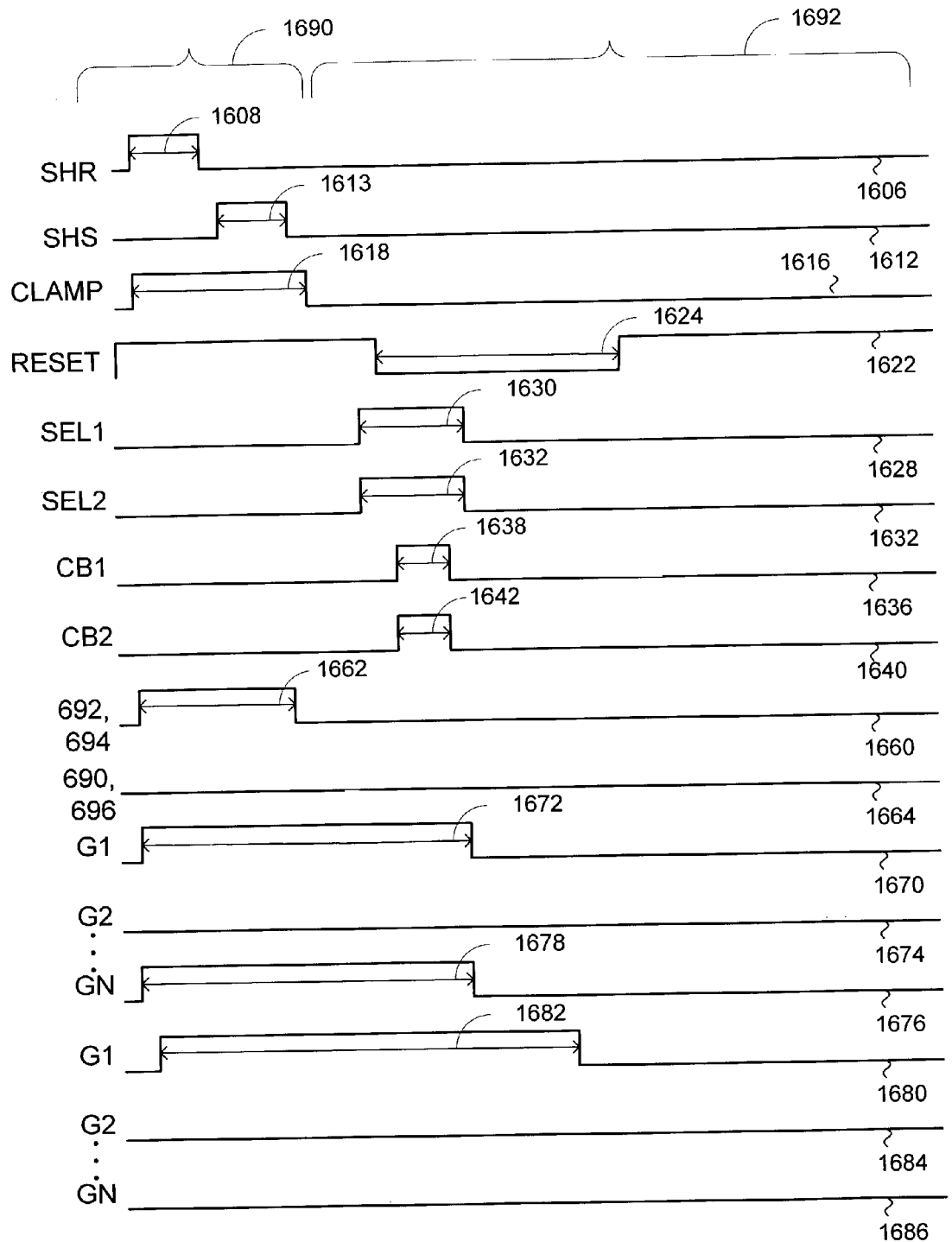
FIG. 12 shows a timing diagram for implementing a weighted sum operation with the APS array and associated processing circuitry of FIGS. 3-6.

Turning to FIG. 12 a weighted sum operation implemented by the operation of the FIGS. 3-6 circuits is now described. In this example, it is assumed that the values stored by the column buffer circuit 434 are being weighted and combined with the values stored by the column buffer circuit 436 which are also weighted. The FIG. 12 weighted sum operation differs from the FIG. 11 average operation in that the weight associated with column buffer circuit 434 may be different from the weight associated with the column buffer circuit 436. Therefore, the various control signals that correspond to the variable capacitors of column buffer circuit 434 may be different from the various control signals that correspond to the variable capacitors of the column buffer circuit 436

In the average operation described above, $C_{si}=1/N$ $(C_f)$, however, in the weighted sum operation, $W_i=C_f/C_{si}$, (i.e., the weighting factor corresponding to the ith set of signals received from the ith column buffer circuit being the ratio of the feedback capacitors to the capacitors in the ith column buffer circuit) where $W_i$ may not be substantially the same as $W_{i+1}$. FIG. 12 depicts the linear operation implemented by the FIGS. 3-6 circuits combining signals received from column buffer circuit 434 with signals received from column buffer circuit 436, where the respective signals received from each column buffer circuit 434, 436 is weighted differently.

In FIG. 12, signal 1670 G1 corresponds to the state of switch G1 in buffer column circuit 434. Signal 1674 G2 corresponds to the state of switch G2 in buffer column circuit 434. Signal 1676 GN corresponds to the state of switch GN in buffer column circuit 434. Signal 1680 G1 corresponds to the state of switch G1 in buffer column circuit 436. Signal 1684 G2 corresponds to the state of switch G2 in buffer column circuit 436. Signal 1686 GN corresponds to the state of switch GN in buffer column circuit 436. Thus, in the example of the FIG. 12 operation of the FIGS. 3-6 circuit, combination of capacitors used in column buffer circuit 434 is different from the combination of capacitors used in column buffer circuit 436. Thus the capacitance value of the variable capacitor in column buffer circuit 434 is different from the capacitance value used in column buffer circuit 436. Consequently, the signals received from column buffer circuit 434 is weighted differently than the signals received from column buffer circuit 436.

Figure 13:
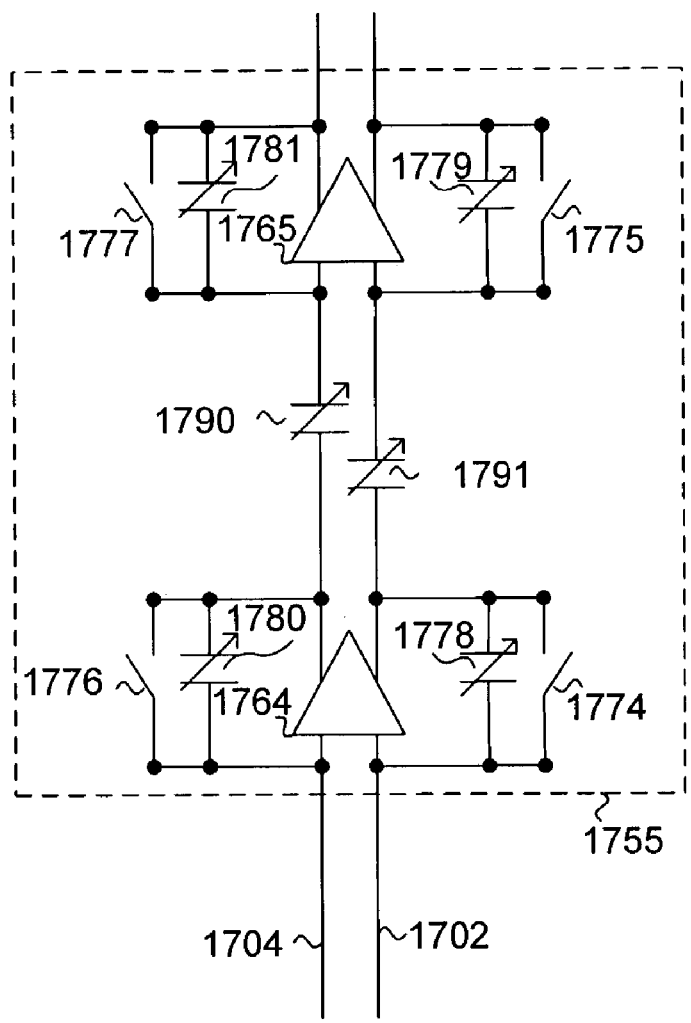
FIG. 13 shows a portion of the FIG. 3 block diagram in greater detail in accordance with another exemplary embodiment of the invention.

FIG. 13 shows a portion of the FIG. 3 block diagram in greater detail in accordance with another exemplary embodiment of the invention. The gain stage 1755 of FIG. 13 differs from the gain stage 455 of FIGS. 3 and 4 in the inclusion of a second amplifier 1765. The gain stage circuit 1755 has two pipelined amplifiers 1764, 1765 with corresponding respective reset switches 1776, 1774, 1777, 1775 and feedback capacitors 1780, 1778, 1781, and 1779. Furthermore, the respective outputs of the first amplifier 1764 are coupled through capacitor 1790, 1791 to the respective inputs of the second amplifier 1765.

Having more than one amplifier in the gain stage 1755 improves the ability to provide a differential output. This improvement is due to the increase in the gain of the signals before the signals are processed by the differential amplifier. The dual amplifier setup also enables a more variable ratio between the variable capacitors 622, 626 in the column buffer circuits 432, 434, 436 and the variable capacitors 1778, 1780, 1779, 1781 in the gain stage 1755.

Figure 14:
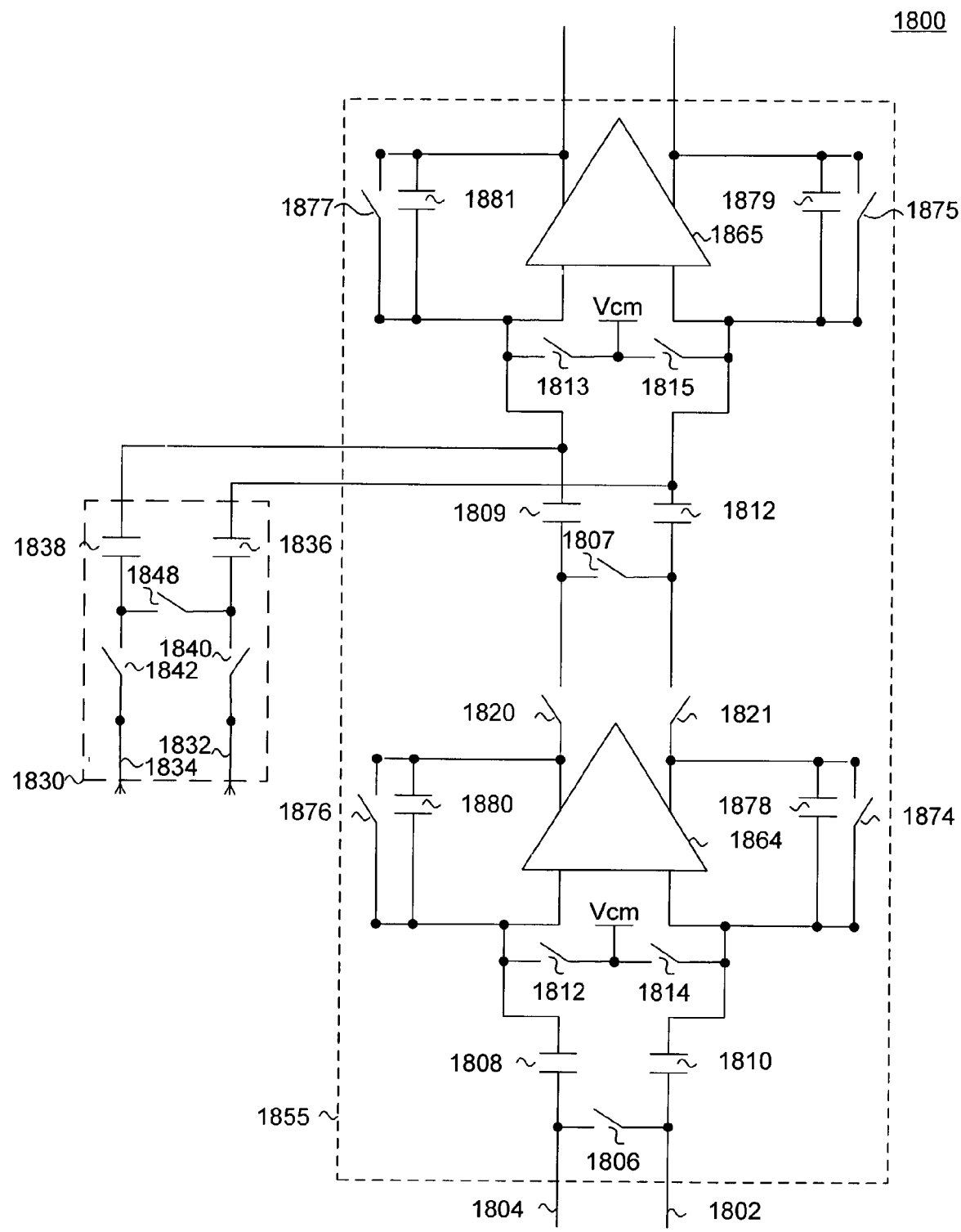
FIG. 14 shows a portion of the FIG. 3 block diagram in greater detail in accordance with yet another exemplary embodiment of the invention.

FIG. 14 shows a portion of the FIG. 3 block diagram in greater detail in accordance with yet another exemplary embodiment of the invention. The gain stage 1855 of the FIG. 14 circuit differs from the gain stage 455 of the FIG. 3 circuit in several significant ways and which will be described in detail below.

The combining circuit 1800 of FIG. 14 includes a compensation circuit 1830 which is coupled to a gain stage circuit 1855. The compensation circuit 1830 can be a column buffer circuit; alternatively, the compensation circuit 1830 can be a storage area that stores two voltage levels but is not received from a column buffer circuit. In the gain stage amplifier 1855 a set of voltage levels output from a column buffer circuit, e.g., column buffer circuit 436, is combined with a set of voltage levels provided by the compensation circuit 1830 to provide a differential output of the combined sets of voltage levels. Consequently, the combining circuit 1800 enables the combination of a plurality of voltage levels in the charge domain of an APS imager array. The operations and advantages of the combination circuit 1800 of FIG. 14 are similar to the operations and advantages provided by the CMOS system 400 as described above. Circuit 1800 may be implemented in APS system 400 to combine a plurality of voltage levels without also requiring the modifications as described above with reference to FIGS. 3-6.

As seen in FIG. 14, the first and second inputs 1804, 1802 to the gain stage circuit 1855 are respectively coupled to the first side of respective capacitors 1808, 1810. The second side of respective capacitors 1808, 1810 is coupled to the respective first and second input of the first gain stage amplifier 1864. The first side of capacitor 1808 is also switchably coupled through switch 1806 to the first side of capacitor 1810. First and second outputs of the gain stage amplifier 1864 are respectively coupled to gain stage amplifier inputs through respective parallel combinations of reset switches 1876, 1874 and feedback capacitors 1880, 1878.

A feedback capacitor 1880 is coupled between the first input and a first output of gain stage amplifier 1864, and a feedback capacitor 1878 is coupled between the second output and the second input of gain stage amplifier 1864. A feedback switching device 1876 is switchably coupled in parallel with the feedback capacitor 1880 and a feedback switching device 1874 is switchably coupled in parallel with the feedback capacitor 1878. The first and second inputs to gain stage amplifier 1864 are switchably coupled through respective switches 1812, 1814 to a voltage source Vcm which serves as a reset voltage.

The first and second outputs of the gain stage amplifier 1864 are respectively switchably coupled through switches 1820, 1821 to the first side of respective capacitors 1809, 1812. The second side of respective capacitors 1809, 1812 is coupled to the respective first and second input of the second gain stage amplifier 1865. The first side of capacitor 1809 is also switchably coupled through switch 1807 to the first side of capacitor 1812. First and second outputs of the second gain stage amplifier 1865 are respectively coupled to gain stage amplifier 1865 inputs through respective parallel combinations of reset switches 1877, 1875 and feedback capacitors 1881, 1879. A feedback capacitor 1881 is coupled between the first input and a first output of gain stage amplifier 1865, and a feedback capacitor 1879 is coupled between the second output and the second input of gain stage amplifier 1865. A feedback switching device 1877 is switchably coupled in parallel with the feedback capacitor 1881 and a feedback switching device 1875 is switchably coupled in parallel with the second feedback capacitor 1879. The first and second inputs to gain stage amplifier 1865 are switchably coupled through respective switches 1813, 1815 to a voltage source Vcm.

The first and second inputs 1834, 1832 to the compensation circuit 1830 are switchably coupled through respective switches 1842, 1840 to the first side of respective capacitors 1838, 1836. The first and second inputs 1834, 1832 are from any source of two voltages, and maybe, for example from a column buffer circuit. The second side of respective capacitors 1838, 1836 is coupled to the respective first and second input of the second gain stage amplifier 1865. The first side of capacitor 1838 is also switchably coupled through switch 1848 to the first side of capacitor 1836.

Figure 15:
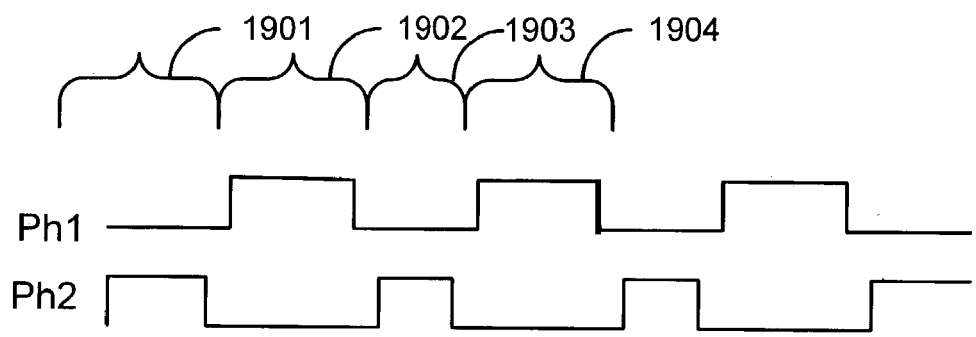
FIG. 15 shows a timing diagram for implementing a linear operation with the APS array and associated processing circuitry of FIG. 14.

Turning to FIG. 15 the basic operation of the FIG. 14 circuit is now described with reference to combining a plurality of signals received from an upstream column buffer circuit from the gain stage 1855, for example, column buffer circuit 434, with a plurality of voltage levels received from the compensation circuit 1830. The combination of voltage levels can be an addition, subtraction, average, or weighted sum operation, analogous to the description of linear operations provided above.

Throughout FIG. 15 a state high signal indicates that a corresponding switch of FIG. 14 is closed (conductive), while a state low signal indicates that the corresponding switch of FIG. 14 is open (non-conductive). Signal Ph1 indicates a state of switches 1806, 1813, 1815, 1820, 1821, 1877, and 1875 in the gain stage circuit 1855 and switches 1840, 1842 in compensation circuit 1830. Signal Ph2 indicates a state of switches 1812, 1814, and 1807 in the gain stage circuit 1855 and switch 1848 in compensation circuit 1830.

Initially in a first time interval 1901, switches 1806, 1813, 1815, 1820, 1821, 1877, and 1875 in the gain stage circuit 1855 and switches 1840, 1842 in compensation circuit 1830 are open (non-conductive) and switches 1812, 1814, and 1807 in the gain stage circuit 1855 and switch 1848 in compensation circuit 1830 are closed (conductive). In a second time interval 1902, all FIG. 14 switch positions are reversed, (e.g., those switches that were open are closed and those switches that were closed are opened). Therefore, switches 1806, 1813, 1815, 1820, 1821, 1877, and 1875 in the gain stage circuit 1855 and switches 1840, 1842 in compensation circuit 1830 are closed (conductive) and switches 1812, 1814, and 1807 in the gain stage circuit 1855 and switch 1848 in compensation circuit 1830 are open (non-conductive). This processing of reversing switch positions continues in subsequent time periods 1903, 1904.

Summarizing the operation depicted in FIG. 15, during the time interval 1901, a plurality of voltage levels received from a pixel cell 104 (FIG. 3) stored in a column buffer circuit 436 and stored on first and second capacitors 1808, 1810 respectively (FIG. 14). Also during the time interval 1901, amplifier 1864 is reset. During time interval 1902, the voltage levels received from respective capacitors 1808, 1810 are transferred through amplifier 1864 and stored on capacitors 1809, 1812. Also during time interval 1902, in compensation circuit 1830, a plurality of voltage levels received from an upstream circuit are stored on respective capacitors 1838, 1836. Amplifier 1865 is also reset during time interval 1902.

During time interval 1903, respective voltage levels received from capacitors 1809, 1812 are combined with the voltage levels received from capacitors 1838, 1836. Thus, a plurality of voltage levels are combined in the gain stage circuit 1855 at the second of two amplifiers in a pipelined amplifier circuit of the analog domain of a CMOS system. Consequently, a method of combining a plurality of voltage levels in the charge domain is provided.

Figure 16:
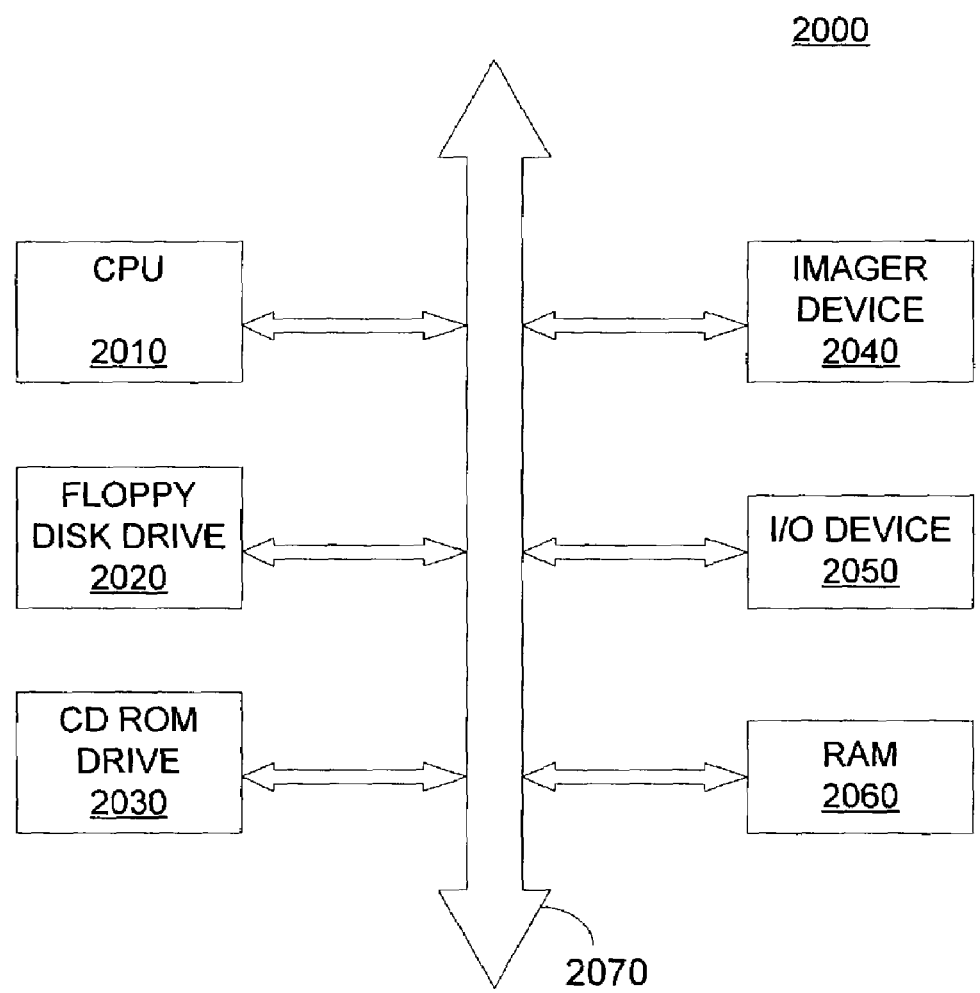
FIG. 16 is a block diagram of a processor based system incorporating an APS array and signal processing circuitry in accordance with an exemplary embodiment of the invention.

FIG. 16 shows system 2000, a typical processor based system modified to include an image sensor IC as in FIGS. 3-6. Processor based systems exemplify systems of digital circuits that could include an image sensor. Examples of processor based systems include, without limitation, computer systems, camera systems, scanners, machine vision systems, vehicle navigation systems, video telephones, surveillance systems, auto focus systems, star tracker systems, motion detection systems, image stabilization systems, and data compression systems for high-definition television, any of which could utilize the invention.

System 2000 includes central processing unit (CPU) 2010 that communicates with various devices over bus 2070. Some of the devices connected to bus 2070 provide communication into and out of system 2000, illustratively including input/output (I/O) device 2050 and imager device 2040. Other devices connected to bus 2070 provide memory, illustratively including random access memory (RAM) 2060, and one or more peripheral memory devices such as floppy disk drive 2020 and compact disk (CD) drive 2030.

There are many advantages available to the designers as a result of the present invention. Examples of several of those advantages are outlined below.

An embodiment of the present invention can provide pre-gain pixel offset correction during pixel read-out. A signal provided by a pixel may include an offset created during the sample and hold operation. An offset may correspond to a color stream associated with a respective pixel. For example, a pixel may have a color of the RGB data stream, i.e., Green1, Red, Blue, and Green2 and each of the four colors has a corresponding offset. Each color offset has a constant value within a chip and is stable over the lifetime of the chip. However, the color offset may vary between chips. There exist conventional methods for measuring color offset components and for generating a correction signal counteracting the effect of the color offset. The correction signal is typically implemented in the digital domain of a CMOS image array after the signal from a pixel has been processed through a gain stage. The present invention can combine in the analog domain a set of signals from a pixel having a color offset with a set of signals programmed to counteract the color offset.

The present invention can also provide a dark level of an image. APS image arrays typically measure the dark level signal of image which is used to offset the integrated signal of the image in the digital domain of an APS image array. The dark level is typically measured by averaging the signals provided by optically dark pixels. The correction for the dark level of an image can be implemented in the analog domain by averaging the dark current from pixels belonging to the same dark row and then subtracting the average dark signal level from each clear pixel. Measuring and including the dark level offset in the analog domain also reduces the digital block size since the analog operations require negligible modification to the existing architecture.

Similarly, the average signal in a region, for example in a row, can be measured in the analog domain which can provide the average signal intensity. The average signal intensity is used in flash triggering and light flickering detection. Flash triggering consists of calibrating the intensity of the flash light for a camera and requires fast read-out of the average intensity of a few selected areas of a scene. Light flickering detection consists of: analyzing the 50 Hz/60 Hz image content of the average signal from a row of pixels which also requires fast read of the signals from the array.

An additional advantage of the present invention is the ability to group, i.e., bin, signals from a variable number of pixels in a row. It is occasionally desirable to group the signal from N pixels together to form a sub-sample of the image which is often used in a viewfinder. The present invention enables binning in the analog domain which has an additional advantage of a higher signal amplitude which will improve the signal to noise ratio of the sub-sampled image at a cost of its spatial resolution.

It should be noted that although the invention is described above with reference to use of n-channel transistors, the invention can be fabricated with complementary technology as well. The processing systems illustrated and described above are only exemplary processing systems with which the invention may be used. The processing systems illustrate processing architectures especially suitable for a general signal processing system, such as a CMOS APS system, it should be recognized that well known modifications can be made to configure the processing systems to become more suitable for use in a variety of applications. For example, many electronic devices which require digital signal processing may be implemented using a simpler architecture which relies on an ADC coupled to a digital processor. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices. Additionally, pixels may be located in both the main part of an imager array, or pixels may be located in a secondary or in a redundant area; and pixels may also be dark pixels.

Furthermore, even though the examples provided show a SHR signal sampled before a SHS signal, the invention is not so limited. Additionally, many of the time intervals shown in the Figs. can be modified and still maintain the spirit and scope of the invention. Even though systems are shown that can implement several different combinations, it may be desirable to implement only one operation. For example, it may be desirable to implement only the addition operation, in which case other circuits, such as the reverse polarity circuit 695 (FIG. 3), may be omitted and still maintain the spirit and scope of the invention.

Although the invention mostly refers to combining signals from a plurality of pixels cells, the invention is not so limited. While preferred embodiments of the invention have been described in the illustrations above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed as new and desired to be protected by Letters Patent of the United States is:

1. An imaging system, comprising:
   a first storage device for storing a first plurality of analog voltage levels received from a first voltage source;
   a second storage device for storing a second plurality of analog voltage levels received from a pixel cell, at least one of said first and second storage devices comprising a reverse polarity circuit for switching a storage location of respective first and second analog voltage levels stored on said storage device; and
   a comparator coupled to said first and second storage devices, said first and second storage devices being coupled together such that said first plurality of analog voltage levels and said second plurality of analog voltage levels are processed prior to being forwarded to said comparator, said comparator configured to compare said processed first and second plurality of analog voltage levels.

2. The system of claim 1, wherein said second storage device comprises a column buffer circuit.

3. The system of claim 1, wherein said second storage device comprises a sample and hold circuit.

4. The system of claim 3, wherein said sample and hold circuit comprises said reverse polarity circuit for switching a storage location of respective first and second analog voltage levels received from said pixel cell.

5. The system of claim 4, wherein said sample and hold circuit comprises a first and second capacitors for respectively storing said plurality of analog voltage levels received from said pixel cell.

6. The system of claim 5, wherein said first and second capacitors are variable capacitors.

7. The system of claim 1, wherein said first storage device comprises a column buffer circuit.

8. the system of claim 1, wherein said first storage device comprises a sample and hold circuit.

9. The system of claim 8, wherein said sample and hold circuit comprises said reverse polarity circuit.

10. The system of claim 9, wherein said sample and hold circuit comprises first and second capacitors for storing said plurality of analog voltage levels received from said first voltage source.

11. The system of claim 10, wherein said first and second capacitors are variable capacitors.

12. The system of claim 1, wherein said comparator comprises a differential amplifier.

13. The system of claim 6, wherein said first and second capacitors are configured to store a reset voltage level and an integration voltage level of said pixel cell.

14. The system of claim 1, wherein said first voltage source is a second pixel cell.

15. The system of claim 14, wherein said second storage device comprises a sample and hold circuit.

16. The system of claim 15, wherein said sample and hold circuit comprises a first and second capacitor for storing first and second analog voltage levels received from said second pixel cell.

17. The system of claim 16, wherein said first and second capacitors are variable capacitors.

18. The system of claim 1, further comprising a second comparator in series with said first comparator, said second comparator for increasing the gain of a signal provided by said first comparator.

19. The system of claim 1, wherein said first voltage source is a plurality of pixels.

20. The system of claim 1, wherein said system is configured to perform an addition operation on said first and second plurality of analog voltage levels.

21. The system of claim 1, wherein said system is configured to perform a subtraction operation on said first and second plurality of analog voltage levels.

22. The system of claim 1, wherein said system is configured to perform an average operation on said first and second plurality of analog voltage levels.

23. The system of claim 1, wherein said system is configured to perform a weighted sum operation on said first and second plurality of analog voltage levels.

24. The system of claim 14, further comprising:
   a column decoder circuit coupled to said first and second storage devices for controlling the operation of said first and second storage devices and for enabling a read out of said first and second devices during a same read out cycle.

25. The system of claim 24, wherein said read out cycle is a clock cycle.

26. The system of claim 24, wherein said first and second storage devices are read out at substantially the same time.

27. The system of claim 24, wherein said first and second storage devices are read out successively.

28. A column buffer device for use with an imaging system, said column buffer device comprising:
   a polarity reversing circuit adapted to receive first and second analog voltages from a pixel cell;
   a first storage device coupled to said polarity reversing circuit for storing one of said first and second analog voltage levels, and
   a second storage device coupled to said polarity reversing circuit for storing the other of said first and second analog voltage levels, wherein when said polarity reversing circuit is in a first state said first and second voltage levels are routed to said first and second storage devices in a first manner and wherein when said polarity reversing circuit is in a second state said first and second voltage levels are routed to said first and second storage devices in a second manner.

29. An imager array for performing linear operations in the analog domain, the array comprising:
   first and second column buffer circuits switchably coupled to a gain stage circuit, at least one of said first and second column buffer circuits comprising a reverse polarity circuit for switching a storage location of respective first and second analog voltage levels stored on said at least one column buffer circuit; and a column decoder circuit coupled to said first and second column buffer circuits, said column decoder circuit configured to couple said first column buffer circuit with said gain stage circuit at substantially the same time said second column buffer circuit is coupled with said gain stage circuit.

30. A method of operating an active pixel sensor integrated circuit, the method comprising:
storing a first plurality of analog voltage levels received from a first voltage source in a first storage device;
storing a second plurality of analog voltage levels received from a pixel cell in a second storage device, wherein at least one of said first and second storage devices comprises a reverse polarity circuit configured to switch a storage location of respective said first and second analog voltage levels stored on said first and second storage devices respectively;
combining said first and second plurality of analog voltage level into first and second combined voltage levels; and
forwarding said first and second combined voltage levels to a comparator to compare said first and second combined voltage levels.

31. The method of claim 30, wherein said act of storing said second plurality of analog voltage levels comprises storing said second plurality of analog voltage levels in a column buffer circuit.

32. The method of claim 30, wherein said act of storing said second plurality of analog voltage levels comprises storing said second plurality of analog voltage levels in a sample and hold circuit.

33. The method of claim 30, wherein said act of storing said second plurality of analog voltage levels comprises changing a state of said reverse polarity circuit to switch said storage location of respective said first and second analog voltage levels received from said pixel cell.

34. The method of claim 32, wherein said act of storing said second plurality of analog voltage levels in said sample and hold circuit further comprises storing said second plurality of analog signals in each of a respective plurality of capacitors.

35. The method of claim 34, wherein said respective plurality of capacitors are variable capacitors.

36. The method of claim 30, wherein said act of storing a first plurality of analog voltage levels comprises storing said first plurality of analog voltage levels received from a second pixel cell.

37. The method of claim 36, wherein said act of storing said first plurality of analog voltage levels further comprises storing said first plurality of analog voltage levels in a column buffer circuit.

38. The method of claim 36, wherein said act of storing a first plurality of analog voltage levels further comprises storing said first plurality of analog voltage levels in a sample and hold circuit.

39. The method of claim 37, wherein said act of storing said second plurality of analog voltage levels comprises changing a state of said reverse polarity circuit to switch said storage location of respective said first and second analog voltage levels received from said pixel cell.

40. The method of claim 38, wherein said storing said first plurality of analog voltage levels in a sample and hold circuit further comprises storing said first plurality of analog signals in each of a respective plurality of capacitors.

41. The method of claim 40, wherein said respective plurality of capacitors are variable capacitors.

42. The method of claim 30, wherein said act of combining comprises performing an addition operation on said first and second plurality of analog voltage levels.

43. The method of claim 30, wherein said act of combining comprises performing a subtraction operation on said first and second plurality of analog voltage levels.

44. The method of claim 30, wherein said act of combining comprises performing an average operation on said first and second plurality of analog voltage levels.

45. The method of claim 30, wherein said act of combining comprises performing a weighted sum operation on said first and second plurality of analog voltage levels.

46. A processor system, comprising:
a processor; and
an imager device coupled to said processor, said imager device comprising:
a first storage device for storing a first plurality of analog voltage levels received from a first voltage source;
a second storage device for storing a second plurality of analog voltage levels received from a pixel cell, at least one of said first and second storage devices comprising a reverse polarity circuit for switching a storage location of respective first and second analog voltage levels stored on said storage device; and
a comparator coupled to said first and second storage devices, said first and second storage devices being coupled together such that said first plurality of analog voltage levels and said second plurality of analog voltage levels are processed prior to being forwarded to said comparator, said comparator configured to compare said processed first and second plurality of analog voltage levels.

47. The system of claim 46, wherein said second storage device comprises a column buffer circuit.

48. The system of claim 46, wherein said second storage device comprises a sample and hold circuit.

49. The system of claim 48, wherein said sample and hold circuit comprises said reverse polarity circuit for switching a storage location of respective first and second analog voltage levels received from said pixel cell.

50. The system of claim 49, wherein said sample and hold circuit comprises a first and second capacitors for respectively storing said plurality of analog voltage levels received from said pixel cell.

51. The system of claim 50, wherein said first and second capacitors are variable capacitors.

52. The system of claim 46, wherein said first storage device comprises a column buffer circuit.

53. The system of claim 46, wherein said first storage device comprises a sample and hold circuit.

54. The system of claim 53, wherein said sample and hold circuit comprises said reverse polarity circuit.

55. The system of claim 54, wherein said sample and hold circuit comprises first and second capacitors for storing said plurality of analog voltage levels received from said first voltage source.

56. The system of claim 55, wherein said first and second capacitors are variable capacitors.

57. The system of claim 46, wherein said comparator comprises a differential amplifier.

58. The system of claim 50, wherein said first and second capacitors are configured to store a reset voltage level and an integration voltage level of said pixel cell.

59. The system of claim 46, wherein said first voltage source is a second pixel cell.

60. The system of claim 59, wherein said second storage device comprises a sample and hold circuit.

61. The system of claim 60, wherein said sample and hold circuit comprises a first and second capacitor for storing first and second analog voltage levels received from said second pixel.

62. The system of claim 61, wherein said first and second capacitors are variable capacitors.

63. The system of claim 46, further comprising a second comparator in series with said first comparator, said second comparator for increasing the gain of a signal provided by said first comparator.

64. The system of claim 46, wherein said first voltage source is a plurality of pixels.

65. The system of claim 46, wherein said system is configured to perform an addition operation on said first and second plurality of analog voltage levels.

66. The system of claim 46, wherein said system is configured to perform a subtraction operation on said first and second plurality of analog voltage levels.

67. The system of claim 46, wherein said system is configured to perform an average operation on said first and second plurality of analog voltage levels.

68. The system of claim 46, wherein said system is configured to perform a weighted sum operation on said first and second plurality of analog voltage levels.

69. The system of claim 59, further comprising:
a column decoder circuit coupled to said first and second storage devices for controlling the operation of said first and second storage devices and for enabling a read out of said first and second devices during a same read out cycle.

70. The system of claim 69, wherein said read out cycle is a clock cycle.

71. The system of claim 69, wherein said first and second storage devices are read out at substantially the same time.

72. The system of claim 69, wherein said first and second storage devices are read out successively.

* * * * *